(12) United States Patent
Breymesser et al.

(10) Patent No.: US 10,998,402 B2
(45) Date of Patent: May 4, 2021

(54) SEMICONDUCTOR DEVICES WITH STEEP JUNCTIONS AND METHODS OF MANUFACTURING THEREOF

(71) Applicant: Infineon Technologies AG, Neubiberg (DE)

(72) Inventors: Alexander Breymesser, Villach (AT); Hans-Joachim Schulze, Taufkirchen (DE); Holger Schulze, Villach (AT); Werner Schustereder, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/548,025

(22) Filed: Aug. 22, 2019

(65) Prior Publication Data
US 2019/0378895 A1    Dec. 12, 2019

Related U.S. Application Data

(62) Division of application No. 15/665,905, filed on Aug. 1, 2017, now Pat. No. 10,475,881.

(30) Foreign Application Priority Data

Aug. 2, 2016   (DE) .......................... 102016114264.6

(51) Int. Cl.
*H01L 29/06*    (2006.01)
*H01L 29/861*   (2006.01)
(Continued)

(52) U.S. Cl.
CPC ........ *H01L 29/0638* (2013.01); *H01L 21/268* (2013.01); *H01L 21/324* (2013.01);
(Continued)

(58) Field of Classification Search
CPC ... H01L 29/0638; H01L 29/861; H01L 29/36; H01L 21/268; H01L 21/324;
(Continued)

(56) References Cited

U.S. PATENT DOCUMENTS 6,982,212 B2   1/2006   Stolk
7,491,629 B2   2/2009   Schulze
(Continued)

FOREIGN PATENT DOCUMENTS

CN    101572233 A     11/2009
DE    102004039209 A1  2/2006
(Continued)

OTHER PUBLICATIONS

Biermann, Jurgen et al., "CIBH Diode with Superior Soft Switching Behavior in 3.3kV Modules for Fast Switching Applications," International Exhibition and Conference for Power Electronics, Intelligent Motion and Power Quality PCIM Europe 2008, May 27, 2008, Nurnberg, Deutschland, 5 pages.
(Continued)

*Primary Examiner* — Ahmed N Sefer
(74) *Attorney, Agent, or Firm* — Slater Matsil, LLP

(57) ABSTRACT

Crystal lattice vacancies are generated in a pretreated section of a semiconductor layer directly adjoining a process surface. Dopants are implanted at least into the pretreated section. A melt section of the semiconductor layer is heated by irradiating the process surface with a laser beam activating the implanted dopants at least in the melt section.

20 Claims, 17 Drawing Sheets

(51) Int. Cl.
  *H01L 29/36* (2006.01)
  *H01L 21/268* (2006.01)
  *H01L 21/324* (2006.01)
  *H01L 29/08* (2006.01)
  *H01L 29/167* (2006.01)
  *H01L 29/739* (2006.01)
  *H01L 21/265* (2006.01)

(52) U.S. Cl.
  CPC ........ *H01L 29/0834* (2013.01); *H01L 29/167* (2013.01); *H01L 29/36* (2013.01); *H01L 29/7395* (2013.01); *H01L 29/861* (2013.01); *H01L 29/8611* (2013.01); *H01L 21/2652* (2013.01); *H01L 29/0623* (2013.01)

(58) Field of Classification Search
  CPC ............... H01L 29/0834; H01L 29/167; H01L 29/7395; H01L 29/8611; H01L 29/0623; H01L 21/2652; H01L 21/22; H01L 29/0684; H01L 29/0688; H01L 29/7393
  See application file for complete search history.

(56) References Cited

U.S. PATENT DOCUMENTS

| | | | |
|---|---|---|---|
| 8,354,709 B2 | 1/2013 | Schulze et al. | |
| 2005/0161746 A1* | 7/2005 | Mauder | H01L 29/0834 257/370 |
| 2008/0128798 A1* | 6/2008 | Schulze | H01L 29/732 257/328 |
| 2009/0087971 A1 | 4/2009 | Colombeau et al. | |
| 2009/0142874 A1 | 6/2009 | Arai | |
| 2009/0267200 A1* | 10/2009 | Gutt | H01L 21/26546 257/655 |
| 2009/0286373 A1 | 11/2009 | Tan et al. | |
| 2009/0305486 A1 | 12/2009 | Schulze et al. | |
| 2010/0124809 A1 | 5/2010 | Ong et al. | |
| 2011/0042791 A1 | 2/2011 | Schulze et al. | |
| 2011/0049664 A1 | 3/2011 | Kuritz | |
| 2013/0075783 A1* | 3/2013 | Yamazaki | H01L 29/36 257/139 |
| 2013/0270681 A1 | 10/2013 | Park | |
| 2014/0246755 A1 | 9/2014 | Yoshimura et al. | |
| 2015/0130013 A1 | 5/2015 | Husken et al. | |
| 2015/0162418 A1 | 6/2015 | Meiser et al. | |
| 2015/0357229 A1* | 12/2015 | Schulze | H01L 21/268 438/133 |
| 2015/0364613 A1* | 12/2015 | Onozawa | H01L 21/2636 257/481 |
| 2015/0380492 A1* | 12/2015 | Schmidt | H01L 29/0804 257/607 |
| 2016/0049474 A1 | 2/2016 | Schmidt et al. | |
| 2016/0064206 A1 | 3/2016 | Schulze et al. | |
| 2016/0372583 A1 | 12/2016 | Suzuki et al. | |
| 2018/0122895 A1* | 5/2018 | Jelinek | H01L 21/3242 |

FOREIGN PATENT DOCUMENTS

| | | |
|---|---|---|
| DE | 102006046845 A1 | 4/2008 |
| DE | 102009019278 A1 | 11/2009 |

OTHER PUBLICATIONS

Lutz, Dr. Josef, "Freilaufdioden für schnell schaltende Leistungsbauelemente," Dissertation von, erschienen bei Isle, ISBN 3-932633-44-X, im Jahre, Mar. 4, 1998, 60 pages.

Sabatier, Clement et al., "Laser annealing of double implanted layers for IGBT Power Devices", IEEE International Conference on Advanced Thermal Processing of Semiconductors, Sep. 30-Oct. 3, 2008, 1 pages.

Venturini, Julien "Laser Thermal Annealing: Enabling ultra-low thermal budget processes for 3D functions formation and devices", IEEE 12th International Workshop on Junction Technology, May 14-15, 2012, 6 pages.

* cited by examiner

SEMICONDUCTOR DEVICES WITH STEEP JUNCTIONS AND METHODS OF MANUFACTURING THEREOF

CROSS-REFERENCE TO RELATED APPLICATIONS

This application is a divisional of U.S. patent application Ser. No. 15/665,905, filed Aug. 1, 2017, which application claims priority to German patent application No. 102016114264.6, filed on Aug. 2, 2016, which applications are hereby incorporated herein by reference in their entirety.

TECHNICAL FIELD

The present invention relates generally to semiconductor devices, and, in particular embodiments, to semiconductor devices with steep junctions and methods of manufacturing thereof.

BACKGROUND

Ion implantation includes ionizing, isolating and accelerating dopant atoms and sweeping an ion beam including the ionized dopant atoms across a wafer surface. The dopant ions enter the wafer and come to rest below the wafer surface. The depth the implanted ions reach in the wafer is a function of the incoming energy of the ions which are slowed in the wafer by electronic interaction and by physical collision with the host atoms in the wafer. The implanted ions are centered around an end-of-range peak. The ions damage the crystal lattice in a section of the wafer they pass by colliding with host atoms and by displacing the concerned host atoms from their lattice sites. Implanted dopant atoms that do not occupy regular lattice sites are electrically inactive and have no impact on the electric characteristics of the substrate. Typically, heating treatments restore the crystal lattice and electrically activate the dopant atoms by shifting them to regular lattice sites.

Conventional furnace heating techniques, for example, RTP (rapid thermal processing) affect all structures previously formed in the wafer. An LTA (laser thermal anneal) directly heats only a section of the semiconductor crystal and has less impact on previously formed structures in the wafer in a distance to the heated section.

In an LTA, absorption depth depends on the wavelength of the laser beam. Absorption depth of a laser beam with a wavelength of 308 nm is typically 10 nm and a melting depth down to which the 308 nm laser beam melts crystalline silicon is in a range up to about 500 nm. Melting depth can be extended to some degree by using antireflective coatings such that more energy of the laser beam is coupled into the semiconductor substrate. There is a need to improve methods for activating implanted dopants.

SUMMARY

According to an embodiment a method of manufacturing semiconductor devices includes implanting impurities through a process surface into a semiconductor layer, wherein crystal lattice vacancies are generated in a pretreated section of the semiconductor layer. Dopants are implanted at least into the pretreated section. A melt section of the semiconductor layer is heated by irradiating the process surface with a laser beam activating the implanted dopants at least in the melt section.

According to another embodiment a semiconductor diode includes a backside structure forming a pn junction with an anode layer and a lightly doped drift zone in the backside structure. A heavily doped cathode structure directly adjoins a metal cathode electrode. A field stop layer forms a first junction with the cathode structure and a second junction with the drift zone. A second junction depth of the second junction with reference to an interface between the metal cathode electrode and the cathode structure is greater than 500 nm and at the second junction a dopant density changes by at least one order of magnitude per 50 nm.

According to another embodiment an insulated gate bipolar transistor includes a backside structure forming pn junctions with body regions of transistor cells formed at a front side and further includes a lightly doped drift zone in the backside structure. A heavily doped collector structure directly adjoins a metal collector electrode. A field stop layer forms a first junction with the collector structure and a second junction with the drift zone. A second junction depth of the second junction with reference to an interface between the metal collector electrode and the collector structure is greater than 500 nm and at the second junction a dopant density changes by at least one order of magnitude per 50 nm.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION OF ILLUSTRATIVE EMBODIMENTS

Figure 1A:
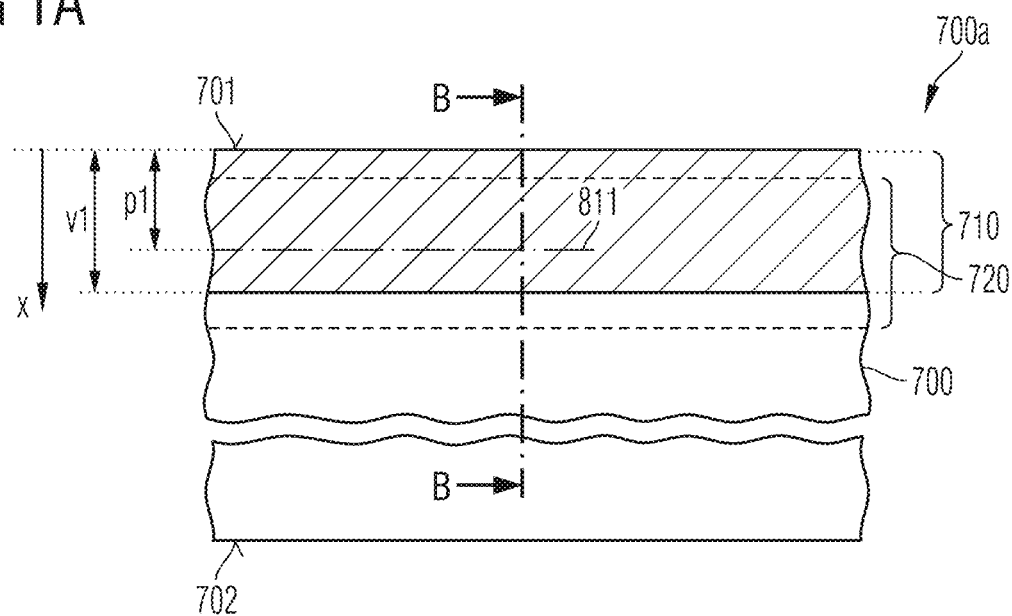
FIG. 1A shows a portion of a semiconductor substrate for illustrating a laser thermal anneal effective on a pretreated section containing crystal lattice vacancies according to an embodiment, after generating crystal lattice vacancies and implanting dopants.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection through a metal and/or a highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D refer to the activation of dopant atoms in a surface layer of a semiconductor substrate 700a.

The semiconductor substrate 700a consists of or includes a semiconductor layer 700 of crystalline semiconductor material, for example silicon (Si), germanium (Ge), silicon germanium (SiGe), silicon carbide (SiC) or an $A_{III}B_V$ semiconductor. At least a portion of the semiconductor substrate 700a may be formed from a crystal ingot, e.g., by sawing. For example, the semiconductor layer 700 may be an epitaxial layer formed by epitaxy on a semiconductor base obtained from a crystal ingot, wherein the semiconductor base is thinned or completely removed after forming the semiconductor layer 700.

In addition to the semiconductor layer 700 the semiconductor substrate 700a may include further layers of insulator material, semiconducting material and/or conductive material. For example, the semiconductor substrate 700a may be a preprocessed silicon wafer with electronic elements formed at a first side.

The semiconductor substrate 700a has a planar process surface 701 at a first side and a support surface 702 parallel to the process surface 701 on an opposite side. A normal to the process surface 701 defines a vertical direction. Directions orthogonal to the vertical direction are horizontal directions.

Crystal lattice vacancies are formed in a pretreated section 710 of the crystalline semiconductor layer 700, wherein the pretreated section 710 directly adjoins the process surface 701. A vertical extension v1 of the pretreated section 710 is at least 500 nm, for example at least 750 nm or at least 1 µm, wherein a vertical extension v1 of the pretreated section 710 may be defined as the distance to the process surface 701 where a lattice vacancy density falls to a value, which is less than 80% or less than half the difference between a maximum vacancy density in the pretreated section 710 and a mean vacancy density in a section of the semiconductor layer 700 outside of and directly adjoining the pretreated section 710. The crystal lattice vacancies include not-occupied regular lattice sites.

The crystal vacancies may be generated, e.g., by one or more damage implants. The implanted atoms may be dopant atoms such as phosphorus, boron, arsenic, selenium or sulfur atoms or may be auxiliary agents, i.e., non-doping atoms such as atoms of silicon, germanium or noble gases, i.e. hydrogen, neon, argon, krypton, and xenon. Alternatively or in addition, crystal lattice vacancies may be generated by using a biased plasma or irradiation with electrons.

Dopant atoms may be implanted into the semiconductor layer 700, wherein the dopant atoms pass at least a section of the pretreated section 710. For example, an end-of-range peak 811 of the implanted dopant atoms is within the pretreated section 710, at the buried edge of the pretreated section 710 or beyond the pretreated section 710. In the embodiment as illustrated in FIGS. 1A and 1B, an implant peak distance p1 between an end-of-range peak 811 and the process surface 701 is smaller than the vertical extension v1 of the pretreated section 710.

The dopant atoms may be implanted before generation of the lattice vacancies or after generation of the lattice vacancies. Implanting the dopant atoms may contribute to generation of the lattice vacancies. Implanting the further impurities raises the density of lattice vacancies to a level significantly higher than generated by the implantation of the dopants provided to be activated alone.

Typically the resulting enhanced maximum local vacancy concentration exceeds 1E13 cm$^{-3}$, e.g., at least 1E14 cm$^{-3}$, at least 1E15 cm$^{-3}$, or at least 1E16 cm$^{-3}$. According to an embodiment the maximum local vacancy concentration is at least 1E17 cm$^{-3}$.

Figure 1B:
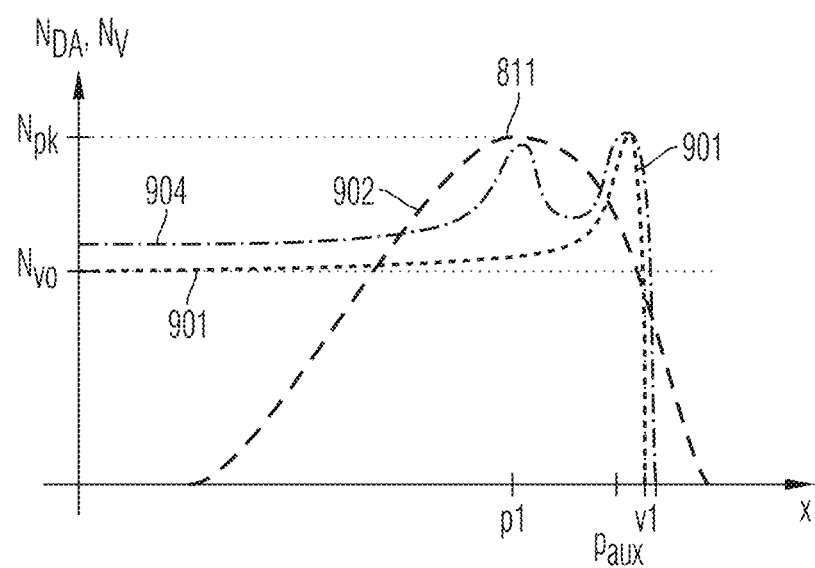
FIG. 1B is a schematic diagram showing vertical distributions of crystal lattice vacancies and implanted dopant atoms along line B-B of FIG. 1A.

FIG. 1A shows the pretreated section 710 of a semiconductor layer 700 of a semiconductor substrate 700a. The vertical extension v1 of the pretreated section 710 may be at least 500 nm, for example at least 750 nm or at least 800 nm. The implanted dopant atoms concentrate in a doped region 720 that partly overlaps with the pretreated section 710 or that is mainly or completely within the pretreated section 710. The dopant concentration $N_{DA}$ has a peak value $N_{pk}$ at a peak distance p1 to the first surface 701.

FIG. 1B shows a vertical lattice vacancy distribution 901 resulting from a single damage implant and a vertical implant dopant distribution 902 of the implanted dopant atoms according to an embodiment with the crystal lattice defects formed in parts by the implantation of the dopant atoms and in parts by implanting a non-doping auxiliary agent, e.g., light atoms.

When ions of an auxiliary agent, e.g., light ions like hydrogen ions (protons) are implanted through the process surface 701 by a non-channeled implant, most of the light ions finally come to rest at costs of crystal damage, e.g., crystal lattice vacancies, at peak distance $p_{aux}$, which is a function of the acceleration energy. Only few ions penetrate deeper into the crystal lattice such that the lattice vacancy density $N_V(x)$ abruptly decreases beyond the peak distance $p_{aux}$. In the region traversed by the light ions, the vertical lattice vacancy distribution 901 may be approximately constant or increases slightly with increasing penetration depth.

The total lattice vacancy distribution 904 shows the sum of the lattice vacancies generated by the damage implant and by the dopant implant. The total lattice vacancy distribution 904 may include two maxima in case the end-of-range-peaks of the two implants have different distances to the process surface 701.

According to an embodiment the pretreated section 710 is not amorphized, i.e., more than half of the theoretical bonds of a complete crystal lattice are still existent before the LTA. A total dopant dose for generating the crystal lattice defects in the pretreated section 710 is at least a factor of three or even one order of magnitude below a threshold above which the crystal is commonly considered amorphized.

The vertical implant dopant distribution 902 may include an end-of-range peak of the dopant atoms within the pretreated section 710 with a peak value $N_{pk}$ at a peak distance p1 to the first process surface 701. A trailing slope of the vertical implant dopant distribution 902 averted from the process surface 701 may approximate a Gaussian distribution, wherein for boron (B) the vertical implant dopant distribution 902 may fall by one order of magnitude from the peak value $N_{pk}$ within about 100 nm. A rising slope of the vertical implant dopant distribution 902 facing the process surface 701 may be shallower than the trailing slope.

Between the process surface 701 and the end-of-range peak the passing dopant ions may further increase the density of crystal vacancies.

Figure 1C:
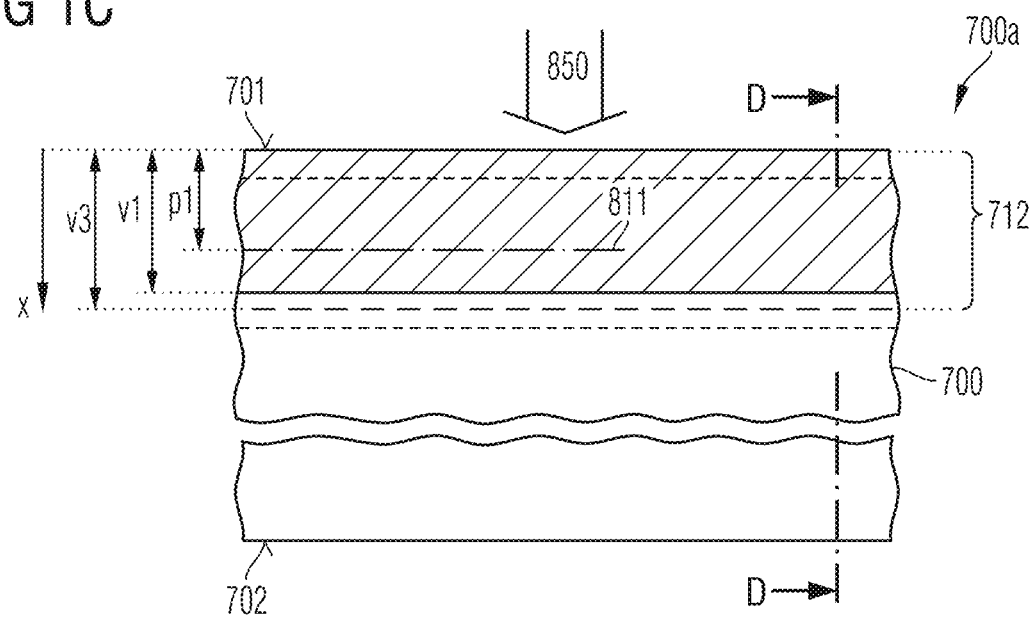
FIG. 1C is a schematic cross-sectional view of the semiconductor substrate portion of FIG. 1A during an LTA according to an embodiment with a melting depth greater than a vertical extension of the pretreated section.
Figure 1D:
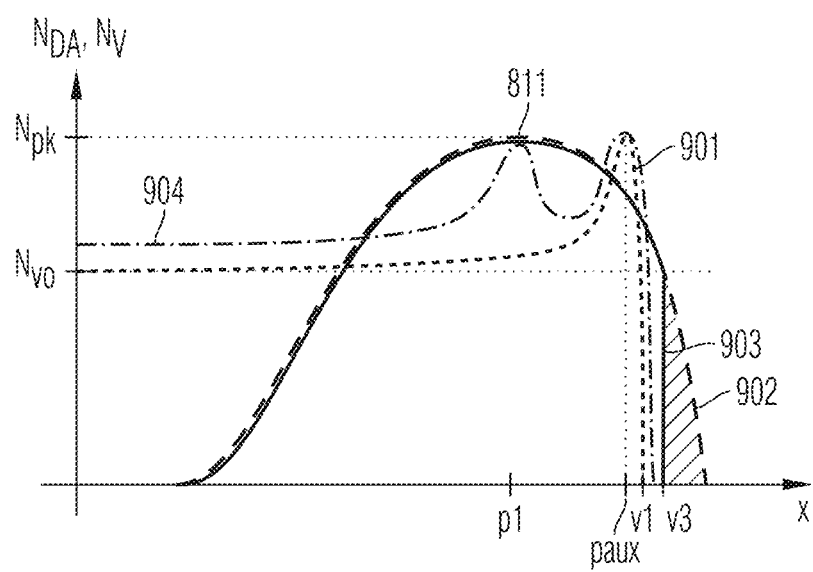
FIG. 1D is a schematic diagram showing a vertical distribution of activated dopants along line D-D in FIG. 1C.

Then a laser beam is applied to the process surface 701 to melt up a section of the crystalline semiconductor layer 700 down to a melting depth v3. In FIGS. 1C and 1D, the melting depth v3 is greater than the vertical extension v1 of the pretreated section 710 and in FIGS. 1E and 1F the melting depth v3 is shallower than the vertical extension v1 of the pretreated section.

FIG. 1C shows a laser beam 850 impinging onto the process surface 701 and directly heating a melt section 712 of the semiconductor layer 700. The melt section 712 may at least partly include the pretreated section 710. In the melt section 712 the laser beam 850 heats the pretreated section 710 to a temperature of at least 1450° C., e.g., at least 1410° C. such that the semiconductor material liquefies for at least 100 µs and at most 10 ms.

Hence, in this embodiment a vertical extension or melting depth v3 of the melt section 712 is equal to or greater than the first vertical extension v1 of the pretreated section 710 such that a great portion of the crystal damage generated by the damage and dopant implants is annealed.

The laser beam 850 may have a wavelength in a range from 150 nm to 1100 nm, e.g., 308 nm and an energy density of at least 1 Jcm$^{-2}$, e.g., 4 Jcm$^{-2}$. Other than a thermal treatment in a furnace, the LTA does not significantly heat directly portions of the semiconductor substrate 700a in a distance to the pretreated section 710, for example, at an opposite side of the semiconductor layer 700.

Where in an undamaged crystal lattice a portion of the energy applied by a laser beam shifts crystal atoms from their regular lattice sites, the crystal lattice vacancies already present in the pretreated section 710 at the time the LTA is applied may allow the immediate transfer of dopant atoms from interstitial sites to regular lattice sites. The transfer of the dopant atoms to free lattice sites consumes less energy than replacing occupied lattice sites with the dopant atoms. Therefore, the heat wave triggered by the irradiation with the laser beam 850 can activate implanted ions in a greater depth of the pretreated section 710 than in a semiconductor layer without crystal vacancies and even beyond the melting depth.

Where conventionally a typical 308 nm laser beam 850 with an energy density of 4 Jcm$^{-2}$ activates dopants only down to a depth of about 500 nm, damaging the crystal lattice in advance facilitates a greater melting depth and allows activation of dopants by a 308 nm laser beam with an energy density of 4 Jcm$^{-2}$ down to at least 500 nm, for example, at least 750 nm.

FIG. 1D shows a vertical active dopant distribution 903 of activated dopants. The dopants are only activated in the melt section 712 between the process surface 701 and the melting depth v3. Implanted dopants outside of the melt section 712 as indicated by the shaded area predominantly remain at their interstitial lattice sites where they are electrically inactive and do not provide electrons or holes.

From the semiconductor substrate 700a, semiconductor dies for power semiconductor diodes, power IGFETs and IGBTs are obtained by, e.g., sawing or laser dicing.

The LTA may broaden to some degree the implantation profile between the end-of-range peak 811 and the process surface 701, but to a lower degree than a heating treatment in a furnace.

A trailing slope of the vertical active dopant distribution 903 is comparatively steep, e.g., falls by at least one, e.g., two orders of magnitude within less than 50 nm, which is significantly steeper than usual trailing slopes of implantation profiles before any heat treatment.

The effect is achieved without any antireflective coating, such that in silicon at least 60% of the laser beam energy of a 308 nm laser beam is reflected. Increasing the effective depth of the laser beam by formation of lattice vacancies may be combined with approaches enhancing the penetration depth of the LTA by the use of antireflective coatings.

Figure 1E:
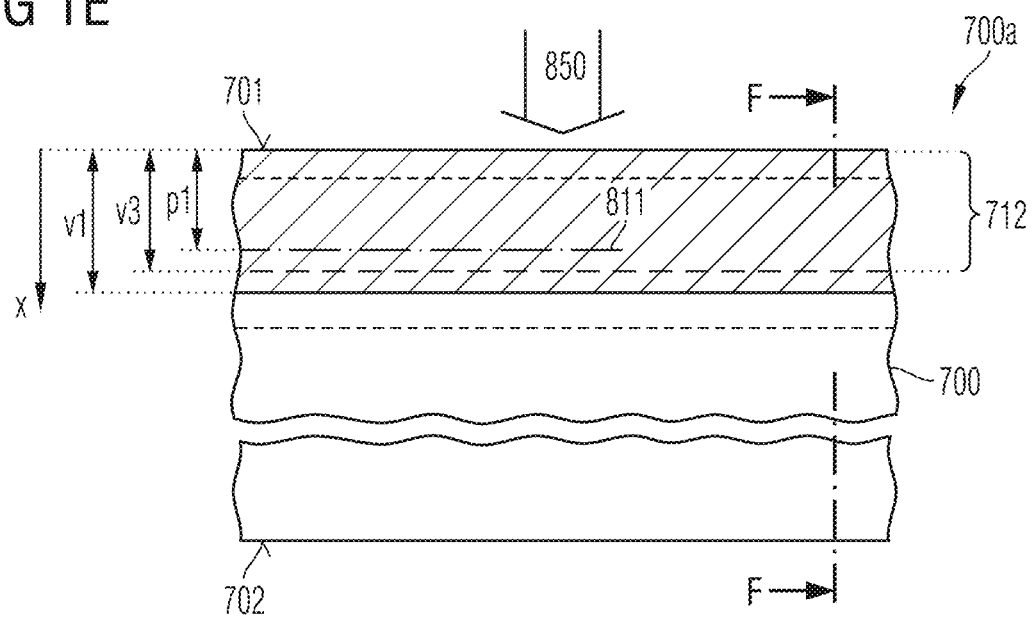
FIG. 1E is a schematic cross-sectional view of the semiconductor substrate portion of FIG. 1A during an LTA according to an embodiment with a melting depth smaller than a vertical extension of the pretreated section.
Figure 1F:
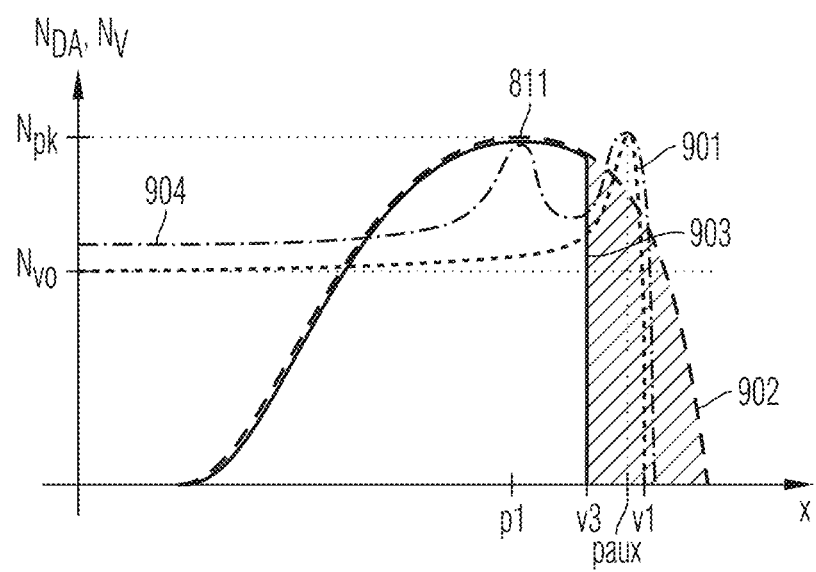
FIG. 1F is a schematic diagram showing a vertical distribution of activated dopants along line F-F in FIG. 1E.

In FIGS. 1E and 1F, the melting depth v3 is smaller than the first vertical extension v1 of the pretreated section 710. Compared to the previous embodiment, steeper junctions may be formed at the cost of crystal quality.

According to FIG. 1F the vertical active dopant distribution 903 of activated dopants steeply decreases at or close to the melting depth v3.

According to another embodiment the dopants are also activated beyond the melt section 712, e.g., across at least 50% of or across the complete vertical extension v1 of the pretreated section 710. With the same vertical implant dopant distribution 902 and the same total lattice vacancy distribution 904 as in FIG. 1F, the resulting vertical active dopant distribution 903 may be the same as illustrated in FIG. 1F for 0≤x≤v3, follows the vertical implant dopant distribution 902 for v3<x≤v1 and steeply decreases around x=v1.

Figure 2A:
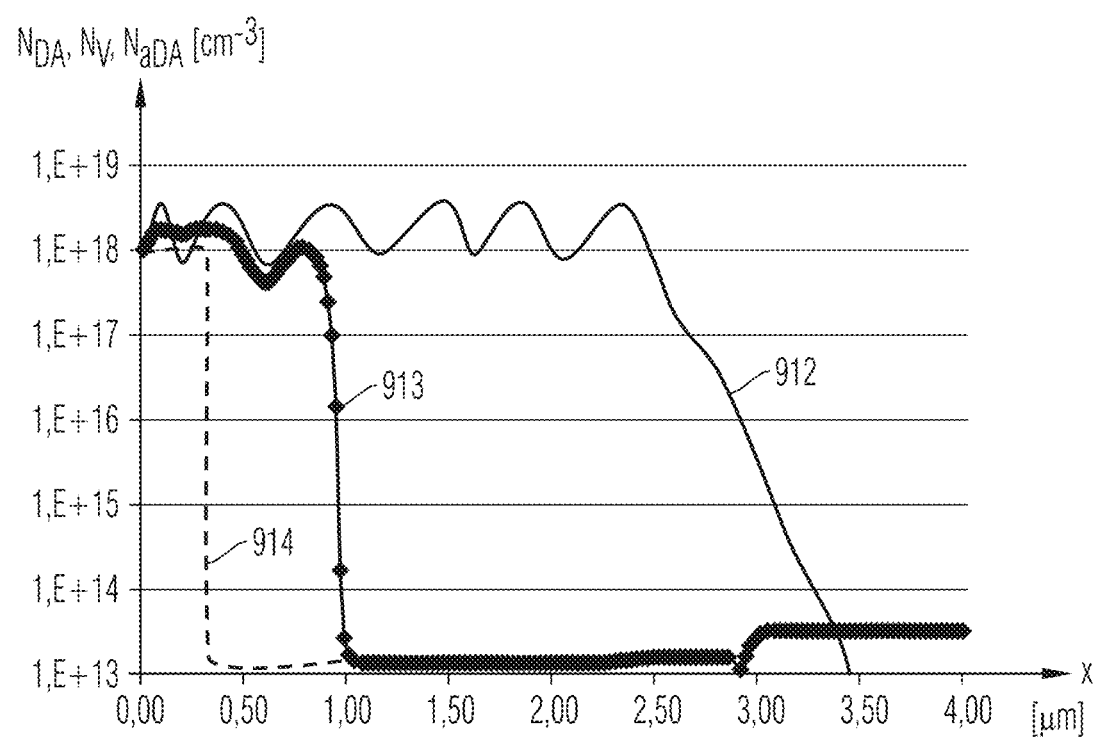
FIG. 2A is a schematic diagram showing vertical distributions of implanted and activated dopants for illustrating effects of the embodiments concerning an LTA at 4 Jcm$^{-2}$.
Figure 2B:
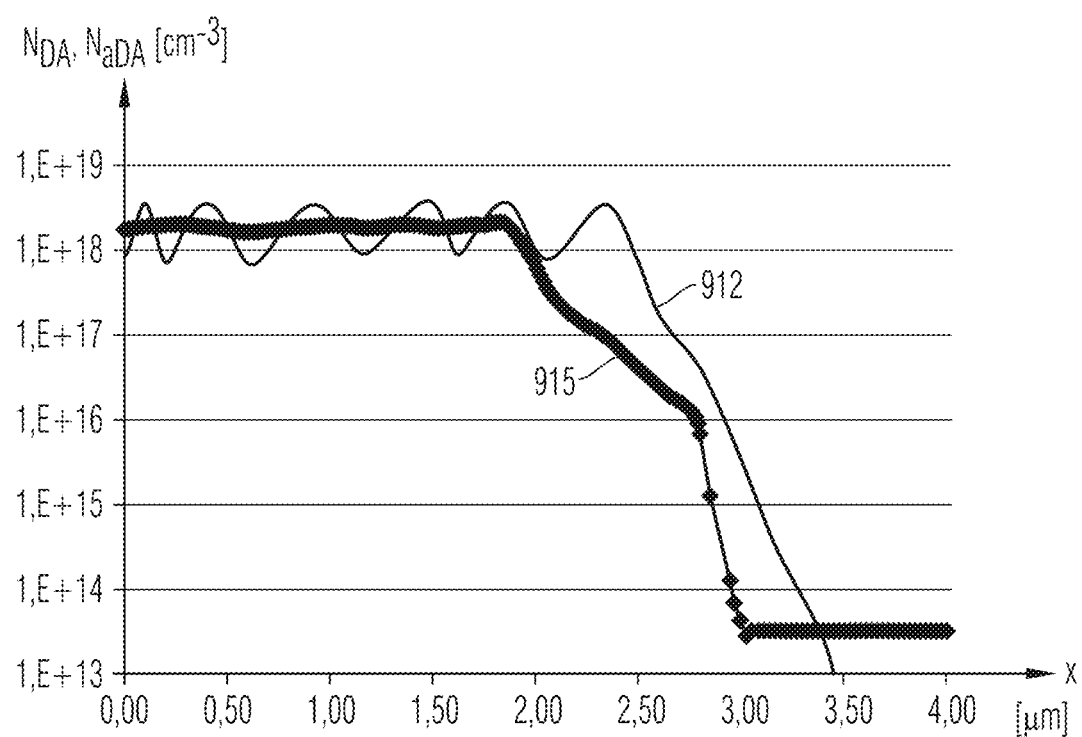
FIG. 2B is a schematic diagram showing vertical distributions of implanted and activated dopants for illustrating effects of the embodiments concerning an LTA at 8 Jcm$^{-2}$.

FIGS. 2A and 2B illustrate the effect of the crystal vacancies on the melting depth.

Dopant atoms, e.g., boron (B) atoms are implanted at approximately the same dose at six different acceleration energy levels. The resulting vertical implanted dopant distribution 912 approximates a "box" with a comparatively uniform dopant concentration in a doped region extending from the process surface at x=0 to a distance of about 2.5 µm. The vertical implanted dopant distribution 912 gives also an approximation of the shape of the vertical lattice vacancy distribution, wherein the lattice vacancy density may fluctuate about a mean lattice vacancy density for 0<x<2.5 µm.

The vertical active dopant distribution 913 in FIG. 2A only falls at a distance of about 1.0 µm to the process surface 701 and shows that an LTA at a wavelength of 308 nm and at an energy of 4 Jcm$^{-2}$ melts the pretreated section and activates the implanted dopants down to a depth of about 1.0 µm. The vertical active dopant distribution 914 for the same LTA applied to a semiconductor layer, which lattice is not damaged or only damaged by implant of the dopants provided for being activated shows that an LTA at a wavelength of 308 nm and at an energy of 4 Jcm$^{-2}$ melts a semiconductor layer, which does not show significant crystal damage in addition to that caused by the implant of the activated dopants, down to a depth of only 400 nm.

The vertical active dopant distribution 915 in FIG. 2B shows that an LTA at a wavelength of 308 nm and at an energy of 8 Jcm$^{-2}$ melts the semiconductor layer and fully activates the implanted dopants down to a depth of about 1.75 µm and partly activates the implanted dopants down to a depth of about 2.75 µm.

Figure 3A:
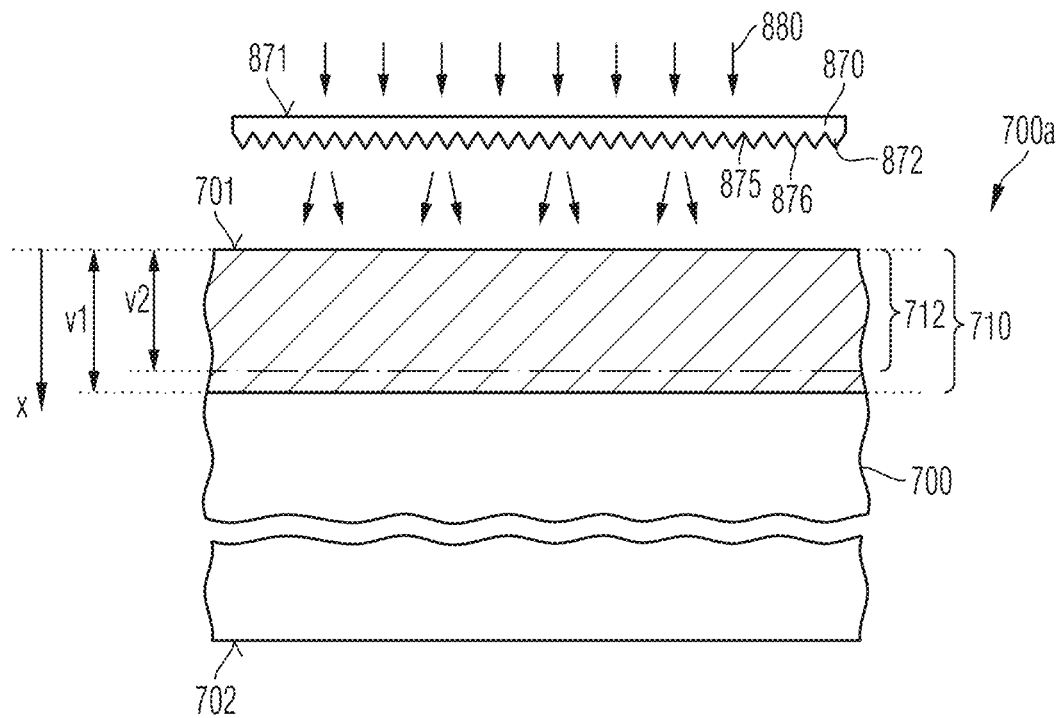
FIG. 3A is a schematic diagram illustrating irradiation of a semiconductor substrate with an ion beam passing an energy filter for illustrating a further method of manufacturing semiconductor devices.
Figure 3B:
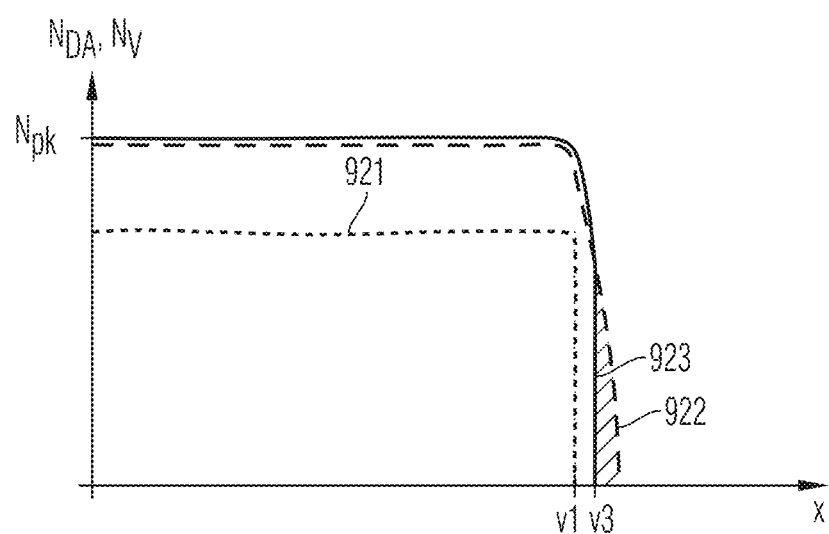
FIG. 3B is a schematic diagram showing vertical distributions of implanted dopants and activated dopants in the semiconductor substrate of FIG. 3A.

The vertical distribution of a lattice vacancy density $N_V$ depends on the method used for generating crystal vacancies. FIGS. 3A and 3B refer to a method that uses an energy filter inserted into an implant beam for modifying the vertical lattice vacancy distribution and the final vertical implant dopant distribution.

FIG. 3A shows an energy filter unit 870 based on one or more materials which form sufficiently stable structures at a thickness at which the materials are sufficiently permeable for particle beams as used for implanting dopant atoms or auxiliary atoms for generating crystal vacancies.

For example, the energy filter unit 870 is based on materials which form stable, thin substrates. The energy filter unit 870 may be mainly based on a layer of crystalline silicon with a thickness in a range from 100 nm to 20 µm, which may be coated with a metal-containing layer to improve stability, ruggedness and/or scattering properties. Permeable portions of the energy filter unit 870 may attenuate the energy of passing particles.

The energy filter unit 870 may be a thin substrate, a membrane or a foil with an exposure surface 871 that may be planar. Opposite to the exposure surface 871, a patterned surface 872 may include grooves and mesas, wherein a mean plane of the grooves and mesas is parallel to the exposure surface 871. The patterned surface 872 may be patterned by etching, grinding, sawing, or by processes using a template or cast, e.g., by casting, by press molding or by stamping.

The patterned surface 872 includes dents 875 extending into the energy filter unit 870 as well as protrusions 876 between neighboring dents 875. The dents 875 may have the same vertical and horizontal extensions or different vertical and/or horizontal extensions. According to an embodiment, the dents 875 may have a vertical extension in a range from 100 nm to 10 µm, for example in a range from 0.2 µm to 8 µm.

Vertical cross-sections of the dents 875 and the protrusions 876 may be rectangles with or without rounded or beveled edges, triangles with or without flattened top or columns with rounded or semicircular tops.

An ion beam 880 containing non-doping auxiliary atoms, or dopant atoms, or at least two different ion beams, one of them containing non-doping auxiliary atoms and the other one containing dopant atoms pass the energy filter unit 870 and impinge on the process surface 701 of the semiconductor layer 700. The illustrated embodiment refers to an embodiment with a first ion beam 880 containing dopant atoms and a second ion beam generating a sufficient number of lattice vacancies in a pretreated section 710 with a vertical extension v1, wherein the first ion beam, the second ion beam or both may pass the energy filter unit 870. For example, the energy filter unit (870) is used to form a graded field stop layer with a smooth dopant profile.

As shown in FIG. 3B, the energy filter unit 870 of FIG. 3A modifies the distribution of the dopants along the vertical direction perpendicular to the process surface 701 such that across a certain vertical range, which is a function of the vertical extension of the dents 875, the vertical implant dopant distribution 922 is approximately uniform for 0<x<v1. The vertical lattice vacancy distribution 921 may also be comparatively uniform or at least above a threshold value for 0<x<v1.

FIG. 3B further shows the vertical active dopant distribution 923 after an LTA effective in a melt section with a vertical extension v3 smaller than, equal to or greater than the vertical extension v1 of the pretreated section.

FIGS. 4A to 4D summarize different vacancy distributions $N_V(x)$ obtained by one or more implants, which may be doping implants or non-doping damage implants using an auxiliary agent, wherein x is the distance to the process surface 701.

Figure 4A:
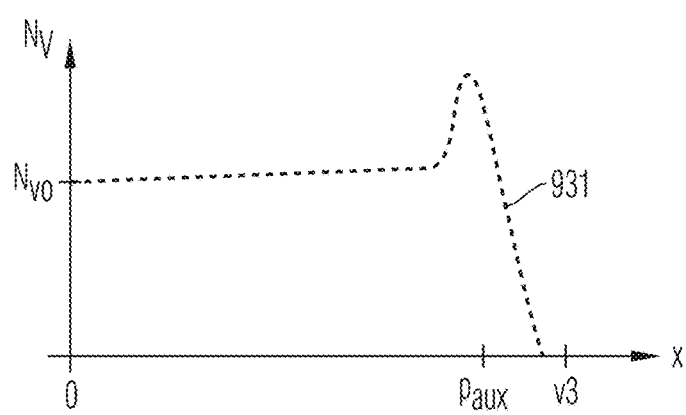
FIG. 4A is a schematic diagram showing a vertical distribution of crystal lattice vacancies according to an embodiment generating the crystal lattice vacancies by a single damage implant.

In FIG. 4A a vertical lattice vacancy distribution 931 results from one single damage implant with an acceleration energy resulting in an end-of-range peak for the auxiliary agent at $x=p_{aux}$ beyond, equal to or smaller than the expected melting depth. Around the end-of-range peak, the distribution of lattice vacancies may approximate a Gaussian distribution. In the portion traversed by the implanted atoms, the vertical lattice vacancy distribution 931 may be approximately uniform or may slightly rise from a minimum vacancy density $N_{V0}$ at or close to the process surface 701.

Figure 4B:
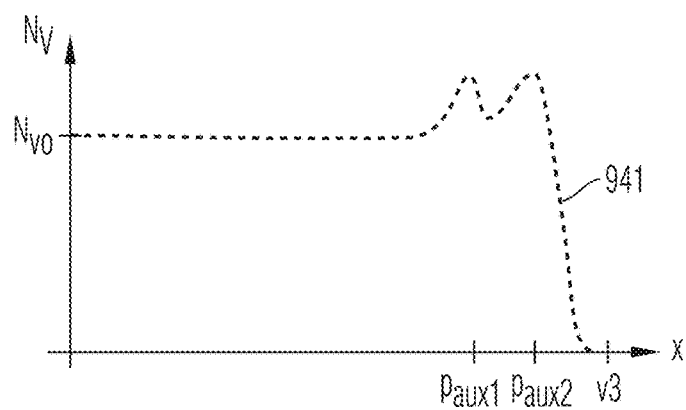
FIG. 4B is a schematic diagram showing a vertical distribution of crystal lattice vacancies according to an embodiment generating the crystal lattice vacancies by at least two damage implants.

In FIG. 4B two damage implants with a first end-of-range peak at $x=p_{aux1}$ and a second end-of-range peak at $x=p_{aux2}$ closer to the process surface than the target melting depth are used to increase the crystal vacancy density $N_V(x)$ in the portion traversed by the implanted ions. The total vertical lattice vacancy distribution 941, which results from the two implants, may approximate a nearly uniform distribution of crystal lattice vacancies up to a distance beyond or close to the expected melting depth.

Figure 4C:
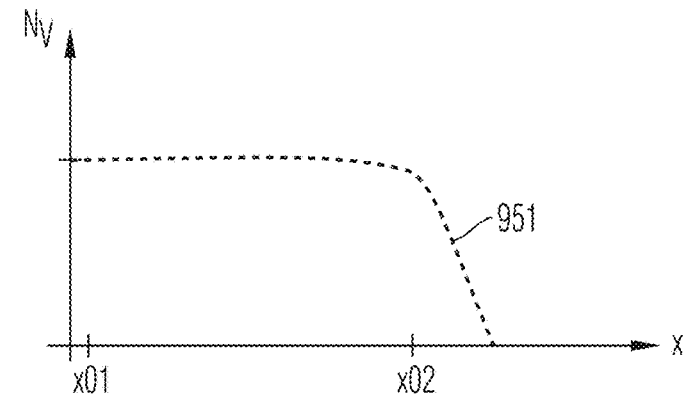
FIG. 4C is a schematic diagram showing a vertical distribution of crystal lattice vacancies according to an embodiment generating the crystal lattice vacancies by a single implant of dopant atoms, wherein an energy filter is inserted in an implant beam.

The vertical lattice vacancy distribution 951 in FIG. 4C may result from implanting an auxiliary agent or dopant atoms by using an energy filter that gradually changes the energy of the implanted auxiliary agent or dopant atoms such that the end-of-range-peak of the implanted ions is spread across a depth that is defined, e.g., by vertical dimensions of dents in protrusions of the energy filter. Accordingly also the vertical lattice vacancy distribution 951 does not show a significant peak or only a shallow peak. The energy filter may be designed to provide an approximately uniform lattice vacancy distribution of the penetration depth of the implanted ions between a first distance x01 and a second distance x02 to the process surface 701, wherein x01 may be 0. The energy filter may compensate a vertical distribution gradient of the crystal vacancies such that a comparatively uniform distribution of the lattice vacancies along the vertical direction can be achieved across a great portion of the expected melting depth.

Figure 4D:
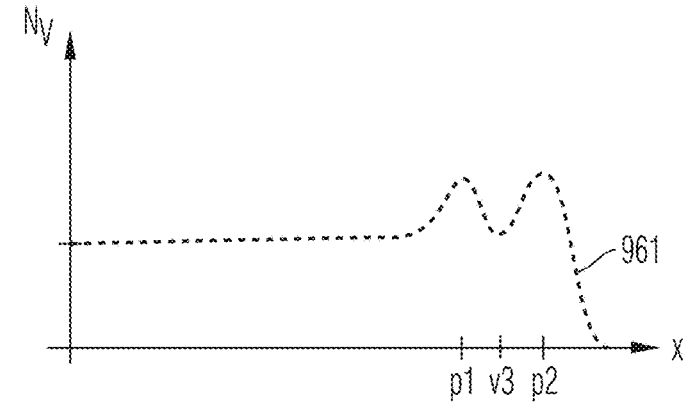
FIG. 4D is a schematic diagram showing a vertical distribution of crystal lattice vacancies according to an embodiment generating the crystal lattice vacancies by at least two implants of dopant atoms.

In FIG. 4D the total lattice vacancy distribution 961 results from two dopant implants, wherein at least one of the dopant implants has an end-of-range peak at a second peak distance p2 beyond the melting depth v3 such that the density of crystal lattice vacancies can be decoupled from the activated dopants.

In each of the discussed alternatives, any implant contributing to the formation of lattice vacancies may be masked such that the vertical dopant distributions may locally change between at least two different profiles with different penetration depths. The approach may be used for a lateral variation of backside emitter characteristics, e.g., in the framework of a LEBE (local enhanced backside emitter) concept or a HDR (high dynamic robustness) concept.

Figure 5A:
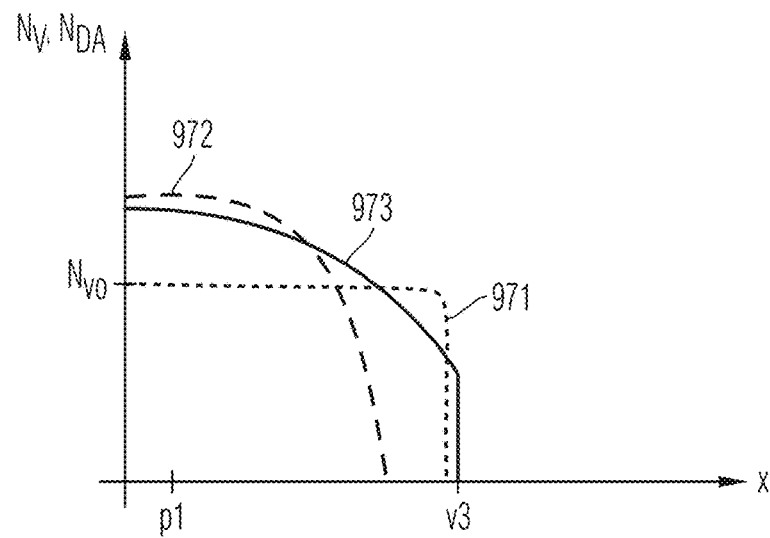
FIG. 5A is a schematic diagram showing vertical distributions of crystal lattice vacancies, implanted dopants and activated dopants according to an embodiment concerning an end-of-range peak of implanted dopants close to the process surface in a pretreated section containing crystal lattice vacancies.
Figure 5B:
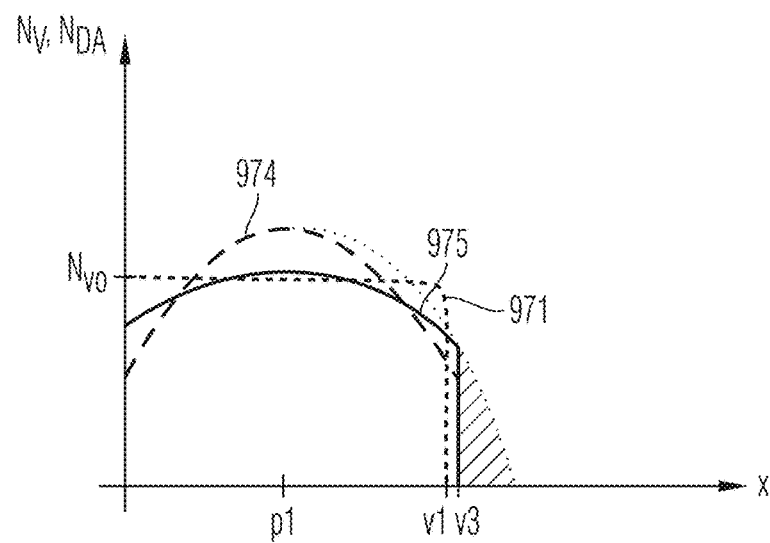
FIG. 5B is a schematic diagram showing vertical distributions of crystal lattice vacancies, implanted dopants and activated dopants according to an embodiment concerning an end-of-range peak of implanted dopants in a vertical center of a pretreated section containing crystal lattice vacancies.
Figure 5C:
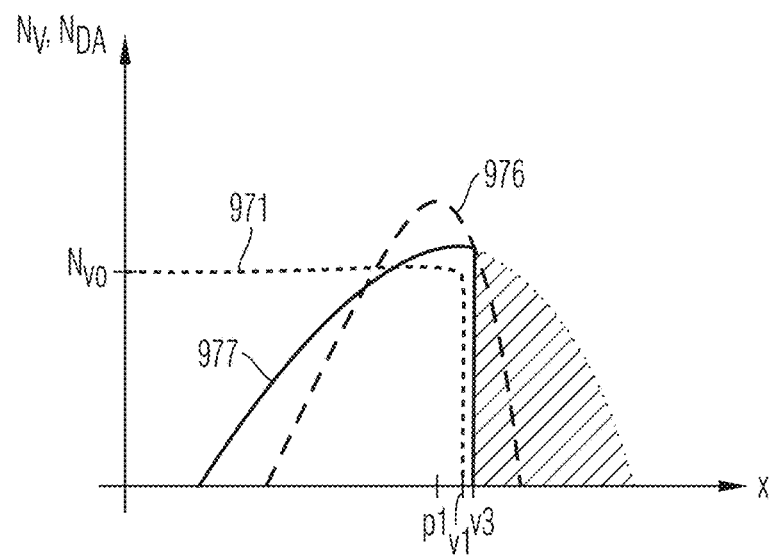
FIG. 5C is a schematic diagram showing vertical distributions of crystal lattice vacancies, implanted dopants and activated dopants according to an embodiment concerning an end-of-range peak of implanted dopants close to the buried edge of the pretreated section containing crystal lattice vacancies.

FIGS. 5A to 5C combine an approximately box-shaped lattice vacancy distribution 971 with different implantation energies for the dopants, wherein the dopant atoms may be boron (B), phosphorus (P), arsenic (As), sulfur (S), or selenium (Se) atoms, by way of example.

In FIG. 5A the dopants are implanted with an end-of-range peak at a peak distance p1 close to the process surface. The implanted dopant density 972 of the implanted dopants has an end-of-range peak within the pretreated section 710 close to the process surface at x=0. By applying an LTA at a wavelength of 308 nm and an energy density of 4 $Jcm^{-2}$ the previously formed crystal vacancies allow the heat wave generated by the laser beam to be effective up to a melting depth v3 with respect to the process surface. The laser beam melts a melt section between the process surface at x=0 and the melting depth v3. During the comparatively short melting time, the implanted dopants are fitted into regular lattice sites and may diffuse to some degree in the vertical direction. The vertical activated dopant distribution 973 sharply decreases at x=v3. Dopants beyond the melting depth v3 remain electrically inactive.

FIG. 5B refers to an implant of dopants with an end-of-range peak approximately in the center of the pretreated section 710. Compared to the implanted dopant distribution 974, the activated dopant distribution 975 may be shallower and abruptly decreases at the melting depth v3. The shaded area indicates the portion of dopants that remain electrically inactive.

In FIG. 5C, the implanted dopant distribution 976 has an end-of-range peak with a peak distance p1 close to the melting depth v3. The resulting activated dopant distribution 977 has a sharp fall from nearly the maximum value.

The presence of the previously formed crystal lattice vacancies allows the activation of dopants down to a melting depth v3, which is greater than a melting depth for the same process in case the crystal does not contain any lattice vacancies or only a comparatively low number of lattice vacancies in addition to the lattice vacancies generated by implanting the target dopants.

The above described method can be used to form steep concentration transitions in a distance greater than 500 nm, e.g., up to 1.5 µm to a die surface at a front side or on the back of a semiconductor die to form sharp unipolar junctions or sharp pn junctions.

Figure 6A:
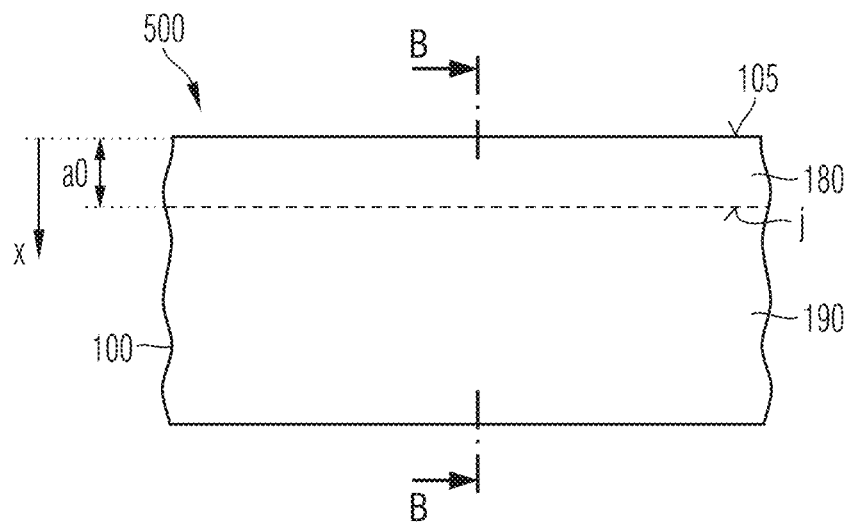
FIG. 6A is a schematic cross-sectional view of a portion of a semiconductor device including a doped target region formed by an LTA according to an embodiment with the doped target region directly adjoining the process surface.
Figure 6B:
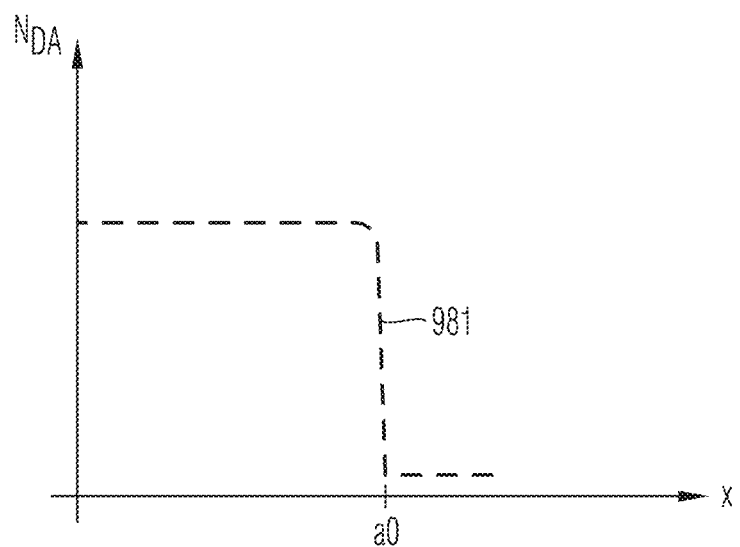
FIG. 6B is a schematic diagram showing vertical distributions of crystal lattice vacancies, implanted dopants and activated dopants along line B-B of FIG. 6A.

FIGS. 6A and 6B refer to a semiconductor device 500 including a semiconductor portion 100 of a crystalline semiconductor material such as silicon (Si), germanium (Ge), silicon germanium (SiGe), silicon carbide (SiC) or any $A_{III}B_V$ semiconductor. The semiconductor portion 100 has a planar die surface 105, which is at a front side or on the back. The method described above may be applied to the formation of doped regions close to the front side, close to the backside or to both doped regions at the front side and doped regions on the back. The doped regions may be blank layers formed across the complete die surface 105. According to other embodiments the doped regions are formed only locally in portions of the die surface 105.

In FIG. 6A the semiconductor portion 100 includes a doped layer 180 directly adjoining the die surface 105. The doped layer 180 forms a junction j, which may be a pn junction or a unipolar junction, with a neighboring layer 190.

A distance between the junction j and the die surface 105 may be at least 500 nm, for example at least 600 nm or at least 800 nm. According to an embodiment, the junction j has a junction depth a0 of at least 1 µm to the die surface 105.

In case of a pn junction, the junction depth a0 is defined at a distance to the die surface 105 where the two complementary dopant types compensate each other. For a unipolar junction, the junction depth a0 is defined by a mean value between the mean dopant concentrations in the sections of the doped layer 180 and the neighboring layer 190 directly adjoining the junction j.

Figure 6C:
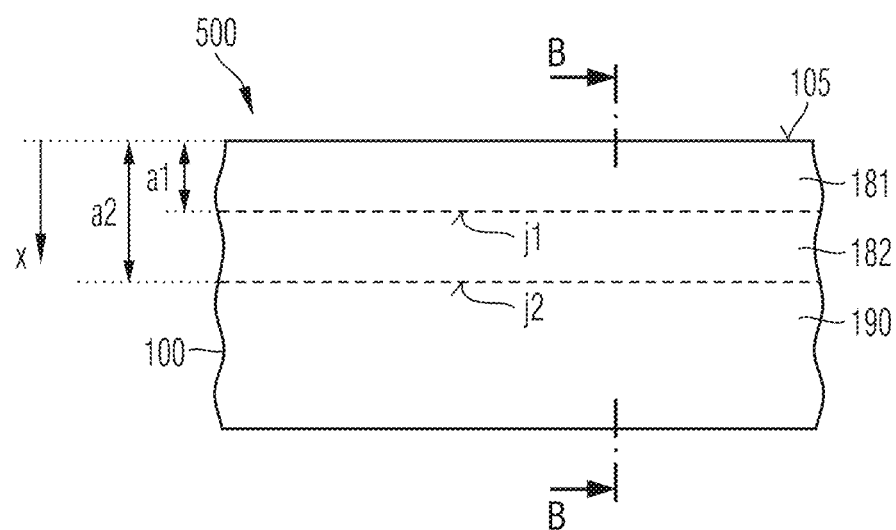
FIG. 6C is a schematic cross-sectional view of a portion of a semiconductor device including a doped target region formed by LTA according to an embodiment with the doped target region in a distance to the process surface.
Figure 6D:
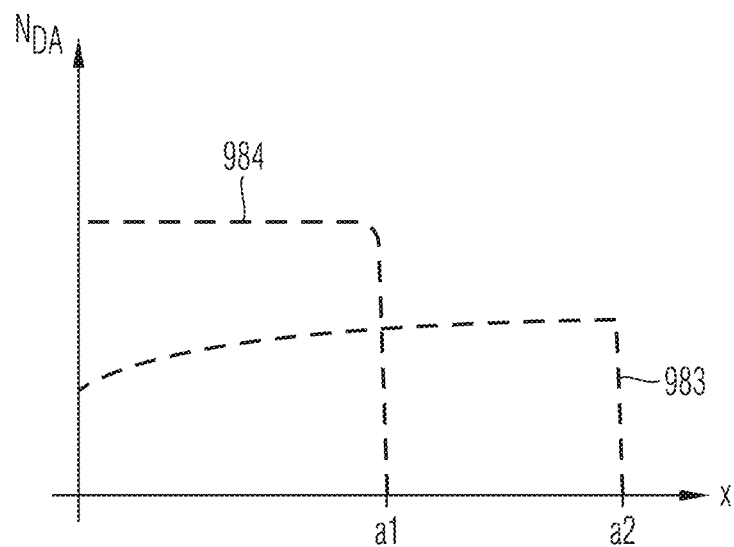
FIG. 6D is a schematic diagram showing vertical distributions of crystal lattice vacancies, implanted dopants and activated dopants along line B-B of FIG. 6C.

FIG. 6B shows that at the junction depth a0 a net dopant concentration $N_{DA}(x)$ of activated dopants drops by at least two orders of magnitude per 50 nm. FIGS. 6C and 6D refer to a semiconductor device 500 with a first doped layer 181 directly adjoining the die surface 105 and a second, complementarily doped layer 182 that forms a first junction j1 with the first doped layer 181 and a second junction j2 with a neighboring layer 190. None, one or both of the first and the second junction j1, j2 may be a pn junction. Both the first and the second junction j1, j2 are steep with a change of at least one order of magnitude per 50 nm.

The first and second junctions j1, j2 may be successively formed in a two-stage process. In a first stage an intermediary doped layer is formed by generating lattice vacancies, implanting dopants and performing a first LTA with a melting depth corresponding to the second junction depth a2.

In a second stage, in a portion of the intermediary layer adjoining the die surface 105 lattice vacancies are generated, dopants are implanted and a second LTA melts the semiconductor down to the first junction depth a1 to form the first doped layer 181, wherein a remaining section of the intermediary layer forms the second doped layer 182.

FIG. 6D shows the resulting vertical activated dopant distributions 983, 984 resulting from the first and second dopant implants. The vertical activated dopant distributions 983, 984 show steep edges at both junctions j1, j2. The implant of the dopants for the first doped layer 181 hardly affects the activated dopant distribution 983 of the first dopants in the second doped layer 182.

The method described above may be applied to doped regions or doped layers at a front side or on the back of a semiconductor die. The following embodiments refer to doped layers formed on the back of semiconductor dies.

Figure 7A:
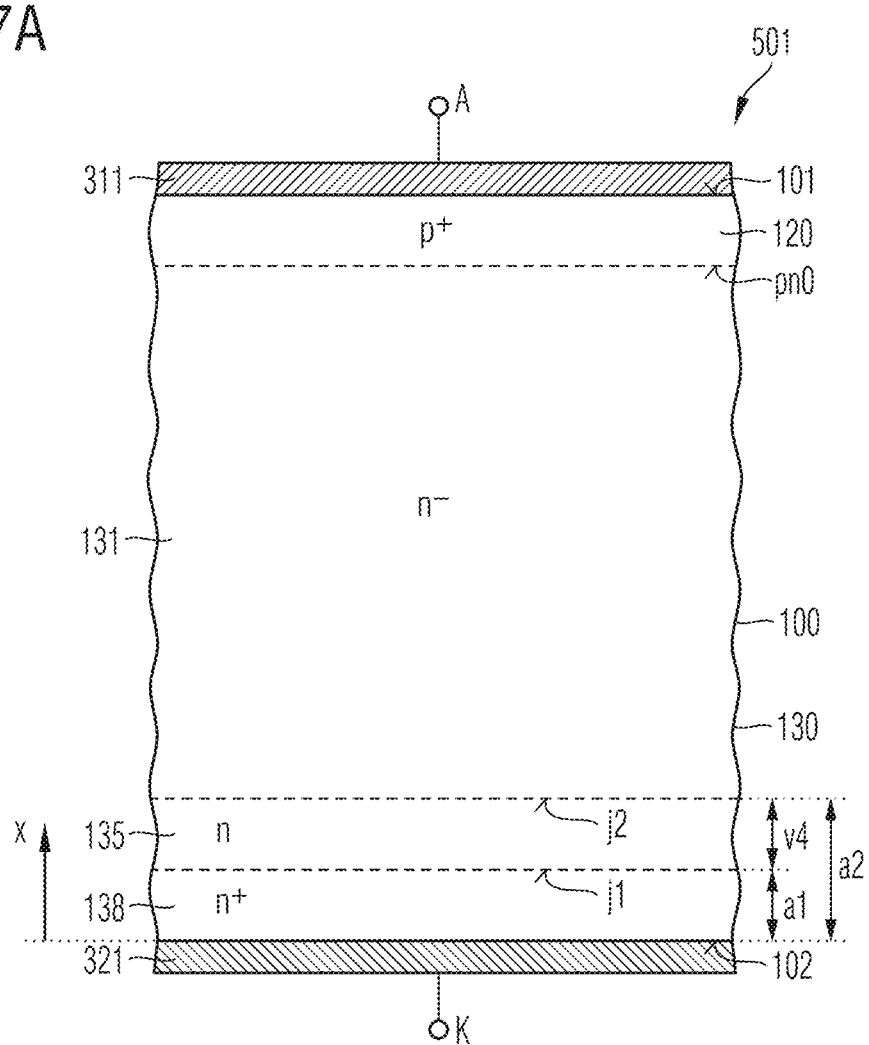
FIG. 7A is a schematic vertical cross-sectional view of a portion of a semiconductor diode according to an embodiment concerning a field stop layer with a box-shaped vertical dopant distribution.
Figure 7B:
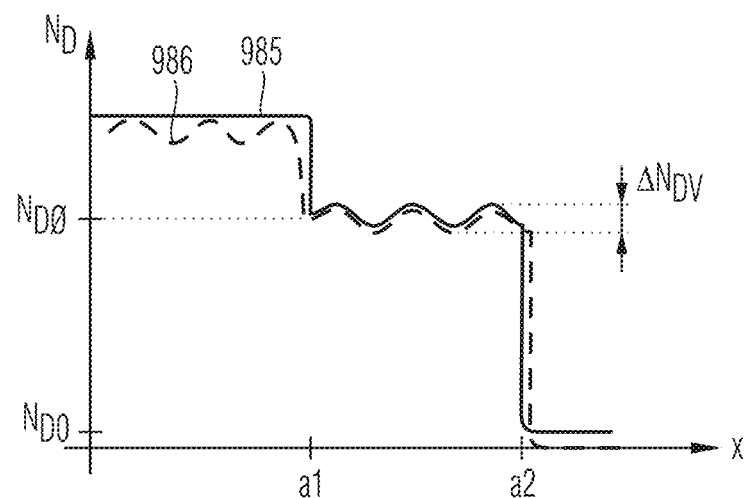
FIG. 7B is a schematic diagram illustrating vertical dopant distributions on a back of the semiconductor diode of FIG. 7A.

FIGS. 7A and 7B refer to a semiconductor diode 501. A semiconductor portion 100 of, e.g. crystalline silicon includes an anode region 120 directly adjoining a first surface 101 of the semiconductor portion 100 and a heavily doped cathode structure 138 directly adjoining a second surface 102 opposite to the first surface 101. A metal anode electrode 311 may directly adjoin the anode region 120, which forms a horizontal pn junction pn0 with a backside structure 130 including a lightly doped drift zone 131 with a dopant concentration $N_{DO}$. A field stop layer 135 may be sandwiched between the lightly doped drift zone 131 and the heavily doped cathode structure 138 and forms a first junction j1 at a first junction depth a1 with the cathode structure 138 and a second junction j2 at a second junction depth a2 with the drift zone 131. A mean dopant concentration $N_{D\varnothing}$ in the field stop layer 135 may be between 1E14 cm$^{-3}$ and 1E16 cm$^{-3}$, wherein the dopant concentration may be approximately uniform. For example, the field stop layer 135 may be formed by an implant beam passing an energy filter unit.

The first junction depth a1 may be in a range from several 10 nm to about 800 nm. The second junction depth a2 may be in a range from 100 nm to 3.0 m, for example in a range from 500 nm to 1.5 m.

As shown in FIG. 7B, a vertical donor concentration 985 may be box-shaped between the two junction depths a1>x>a2, wherein within the field stop layer 135 the donor concentration $N_D$ deviates from the mean donor concentration $N_{D\varnothing}$ by a deviation $N_{DV}$ of not more than 50% of the mean donor concentration $N_{D\varnothing}$.

For 0<x<a1 the vertical donor distribution 985 may be approximately uniform, e.g., in case the cathode structure 138 results from thinning a heavily doped base substrate. According to other embodiments, the portion of the vertical donor distribution 985, 986 in the cathode structure 138 may be Gaussian or may result from superposition of several Gaussian distributions. According to other embodiments, the vertical donor distribution 985, 986 may result from any of the above described methods.

According to the vertical donor distribution 986 both the cathode structure 138 and the field stop layer 135 are formed by six implants at different acceleration energies, wherein the three implants closest to the second surface 102 have a higher dose than the three farer implants. With the approximately box-shaped dopant profile of the field stop layer 135, for a given amount of electrically active dopants for baring a depletion zone to expand into direction of the metal cathode electrode 321 through the heavily doped cathode structure 138, a vertical extension v4 of the field stop layer 135 can be provided shorter. The thinner the field stop layer 135, the lower are switching losses such that the box-shaped vertical distributions 985, 986 result in a reduction of switching losses. Compared to other methods of forming the field stop layer 135, the method as described above allows for a greater distance of the field stop layer 135 to the second surface 102 such that the cathode structure 138 is thicker and less prone to adverse effects induced by, e.g., cosmic radiation.

Figure 8A:
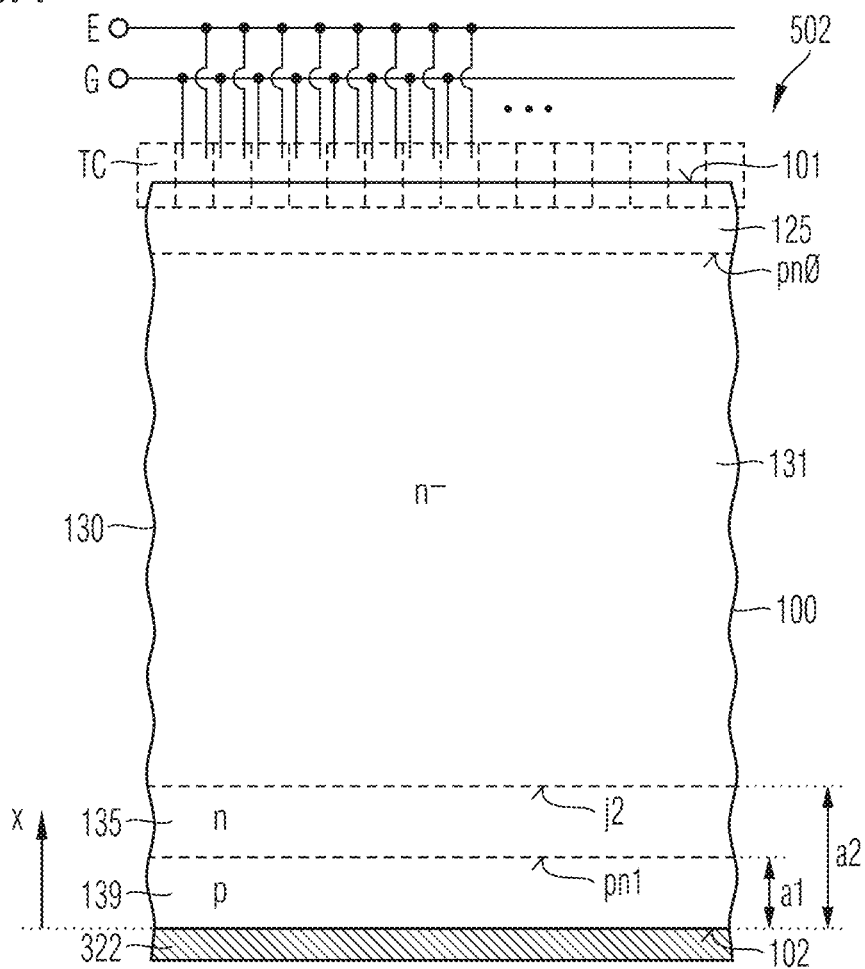
FIG. 8A is a schematic vertical cross-sectional view of a portion of an IGBT (insulated gate bipolar transistor) according to an embodiment concerning a field stop layer with a box-shaped vertical dopant distribution.
Figure 8B:
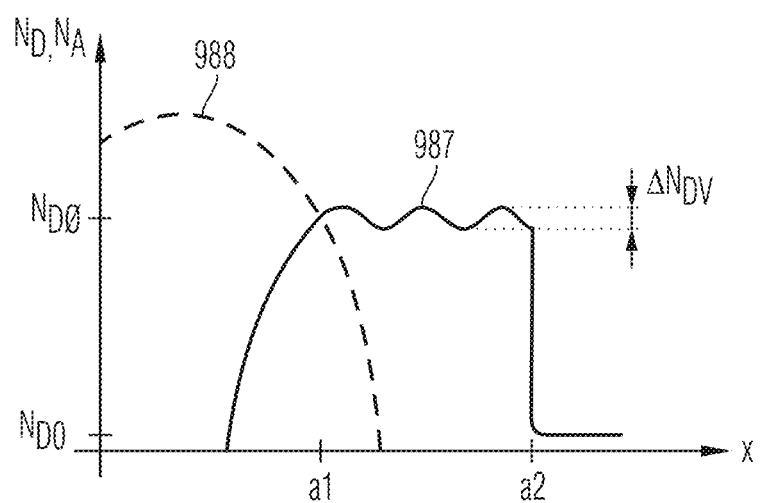
FIG. 8B is a schematic diagram illustrating vertical dopant distributions on a back of the IGBT of FIG. 8A.

FIGS. 8A and 8B refer to an IGBT 502 with a field stop layer 135 between a lightly doped drift zone 131 and a more heavily doped collector structure 139 that forms an ohmic contact with a metal collector electrode 322 along the second surface 102. The drift zone 131 forms first pn junctions pn0 with body regions 125 of transistor cells TC formed along the first surface 101. The transistor cells TC may be IGFET (insulated gate field effect transistor) cells of the enhancement-type, which gate electrodes are electrically connected to a gate terminal G and which source zones are electrically connected to an emitter terminal E.

In FIG. 8B a vertical donor distribution 987 may be box-shaped in the region of the field stop layer 135. A first junction depth a1 of a first pn junction pn1 between the collector structure 139 and the field stop layer 135 with respect to the second surface 102 may be in a range from 10 nm to 800 nm. A second junction depth a2 of the unipolar junction j2 between field stop layer 135 and the drift zone 131 with regard to the second surface 102 may be in a range from 500 nm to 5 µm. At the unipolar junction j2 the concentration of activated dopants may change by at least two orders of magnitude per 50 nm.

A vertical acceptor distribution 988 in the collector structure 139 may be box-shaped or Gaussian-shaped as illustrated. According to other embodiments the vertical acceptor distribution 988 may result from superposition of several Gaussian distributions resulting from diffusion in a melt if the implants for the collector structure 139 and the field stop layer 135 are activated in the same LTA. The vertical acceptor distribution 988 may have a steep trailing edge at the first junction depth a1 in case of two separated LTAs for the field stop layer 135 and the collector structure 139 or may be uniform for 0>x>a1 in case the collector structure 139 results from a heavily doped base substrate, which is thinned before implant of the donors for the formation of the field stop layer 135.

Shifting the range, in which steep junctions can be formed to a deeper junction depth provides more degrees of freedom for the patterning of doped regions in a section of the semiconductor portion 100 close to the back.

Figure 9A:
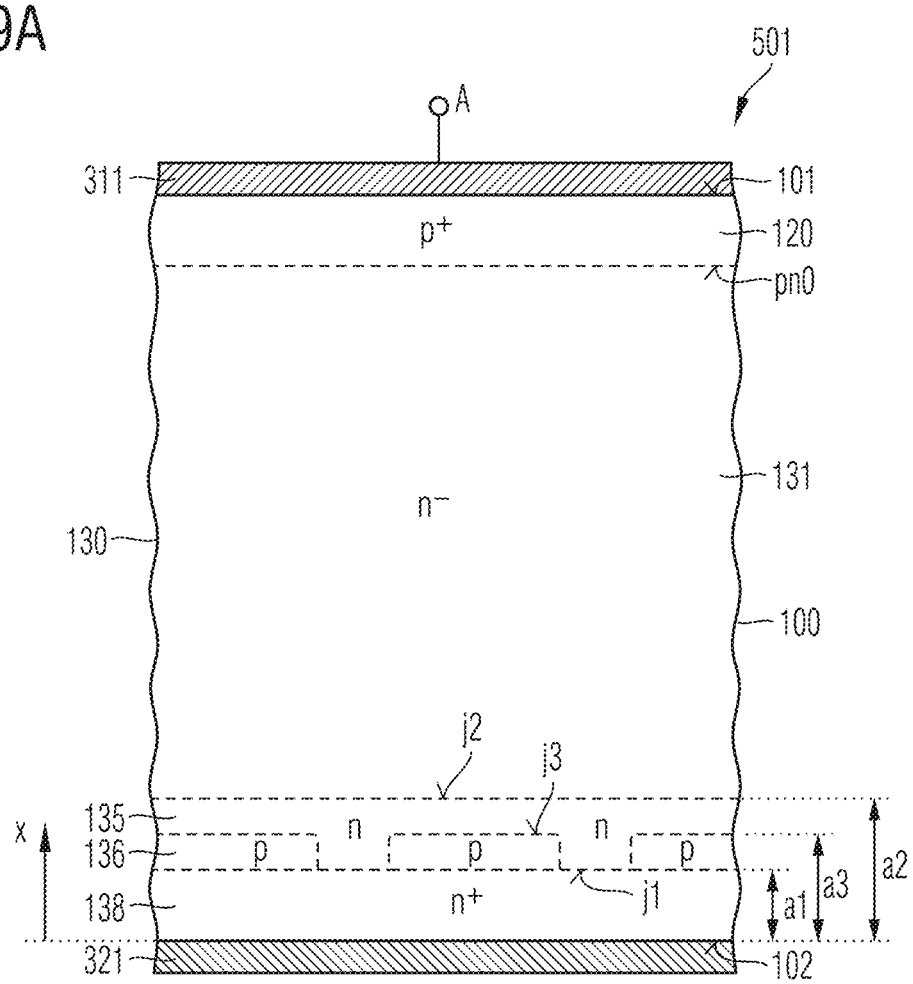
FIG. 9A is a schematic vertical cross-sectional view of a portion of a semiconductor diode according to an embodiment concerning a CIBH (controlled injection of backside holes) structure with a box-shaped vertical dopant distribution.
Figure 9B:
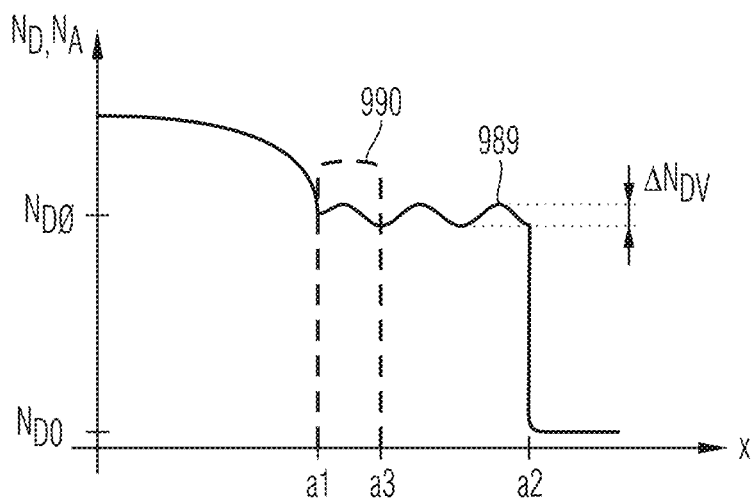
FIG. 9B is a schematic diagram illustrating vertical dopant distributions on a back of the semiconductor diode of FIG. 9A.

FIGS. 9A and 9B refer to a semiconductor diode 501 exploiting a CIBH (controlled injection of backside holes) concept. To this purpose, the semiconductor diode 501 includes counter-doped regions 136, e.g., p-islands, p-stripes or a p-grid in the field stop layer 135 or sandwiched between the field stop layer 135 and the cathode structure 138 wherein the p-islands, p-stripes or a p-grid may form part of a CIBH (controlled injection of backside hole) structure. During reverse recovery the counter-doped regions 136 inject holes into the drift zone 131 and avoid the evolution of a high electric field peak along the cathode structure 138. The injected holes keep the charge carrier plasma high in a region close to the cathode structure 138, slow down the removal of the plasma from the drift zone 131 and in this way support soft reverse recovery.

In the semiconductor diode 501 of FIGS. 9A and 9B the field stop layer 135 may be formed as described above. Before LTA or in separated LTAs after the formation of the field stop layer 135 the counter-doped regions 136 and/or the cathode structure 138 can be formed by using an LTA with preceding formation of lattice vacancies.

FIG. 9B shows a box-shaped vertical acceptor distribution 990 for the counter-doped regions 136 between the first junction depth a1 and a third junction depth a3 as well as a box-shaped vertical donor distribution 989 for the field stop layer 135 at least between the third junction depth a3 and the second junction depth a2.

Figure 10A:
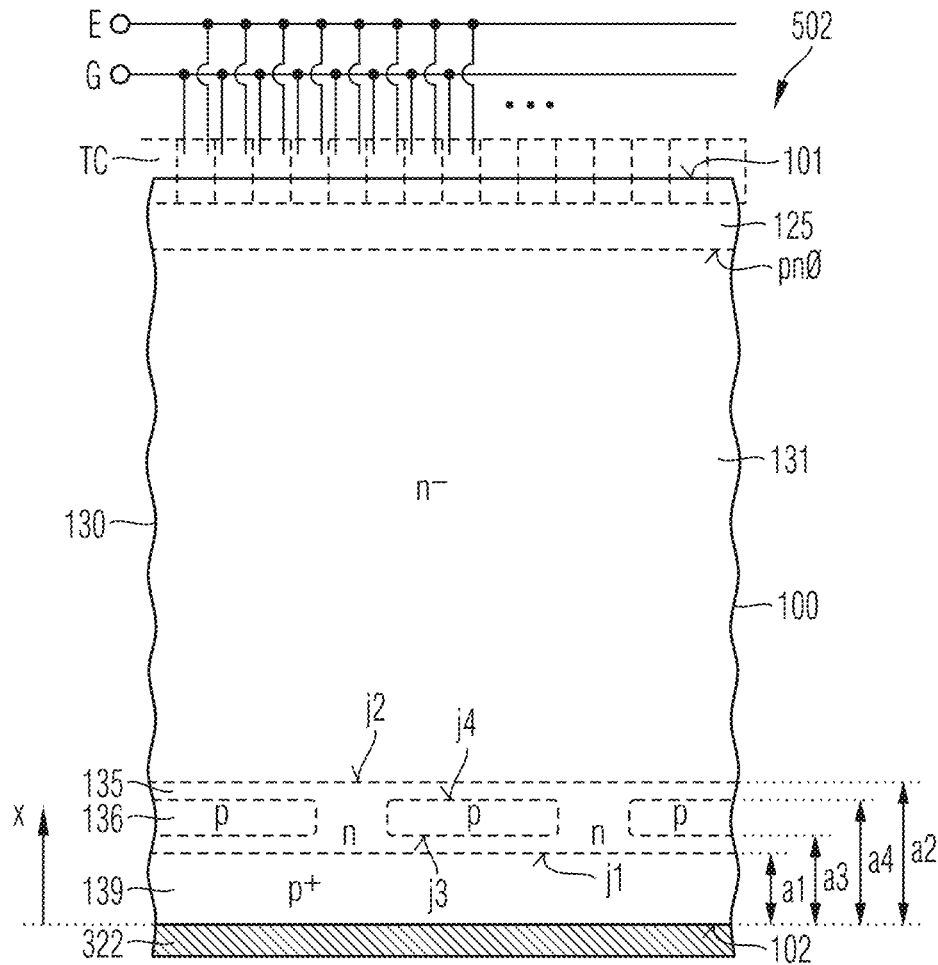
FIG. 10A is a schematic vertical cross-sectional view of a portion of an IGBT according to an embodiment concerning a CIBH structure with a box-shaped vertical dopant distribution.
Figure 10B:
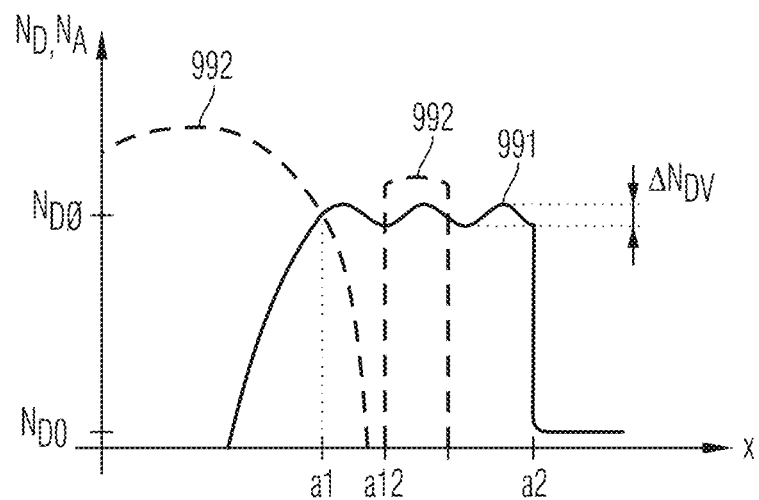
FIG. 10B is a schematic diagram illustrating vertical dopant distributions on a back of the IGBT of FIG. 10A.

FIGS. 10A and 10B expand the CIBH concept to an IGBT, wherein the counter-doped regions 136 are formed within the field stop layer 135 between a third and a fourth junction depth a3, a4 with reference to the second surface 102.

FIG. 10B shows a vertical acceptor distribution 992 including a box-shaped portion for the counter-doped regions 136 between the third and fourth junction depths a3, a4 and Gaussian portion for the collector structure 139 as well as a box-shaped vertical donor distribution 991 for the field stop layer 135 at least between the first junction depth a1 and the second junction depth a2.

Figure 11A:
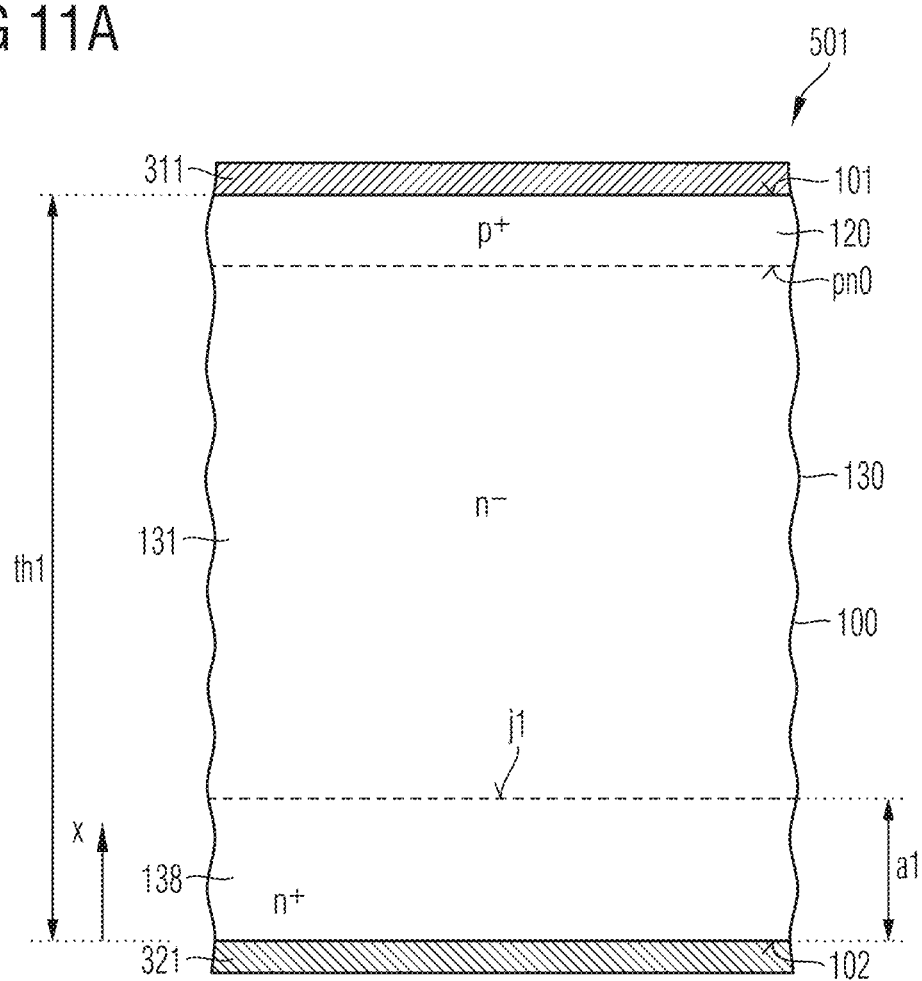
FIG. 11A is a schematic vertical cross-sectional view of a portion of a semiconductor according to an embodiment concerning a semiconductor diode with deep implanted backside emitter.
Figure 11B:
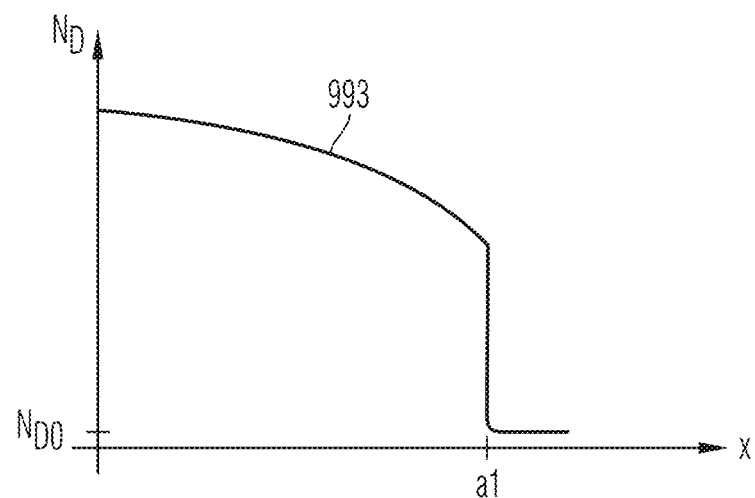
FIG. 11B is a schematic diagram illustrating vertical dopant distributions on a back of the semiconductor diode of FIG. 11A.

FIGS. 11A and 11B refer to a semiconductor diode 501 with a vertical extension of the cathode structure 138 of at least 500 nm, for example at least 600 nm, wherein the cathode structure 138 can be formed by using one of the methods as described above. The semiconductor diode 501 has a semiconductor portion 100 with a thickness th1 between the first and the second surface 101, 102 of at most 100 µm. A mean dopant concentration in the drift zone 131 is at least 1E13 cm$^{-3}$ and may be at most 1E14 cm$^{-3}$. The drift zone 131 may be formed by epitaxial growth on a heavily doped base substrate, which later is removed. After removal of the heavily doped base substrate, the heavily doped cathode structure 138 is formed by an implant through the second surface 102. By applying one of the methods as described above, a vertical extension a1 of the heavily doped implanted cathode structure 138 may be greater than 500 nm, for example, greater than 750 nm. Thicker cathode structures 138 are less prone to defects caused by, e.g., cosmic radiation.

The vertical donor distribution 993 in FIG. 11B shows a comparatively steep junction at a comparatively deep junction depth a1.

Figure 12A:
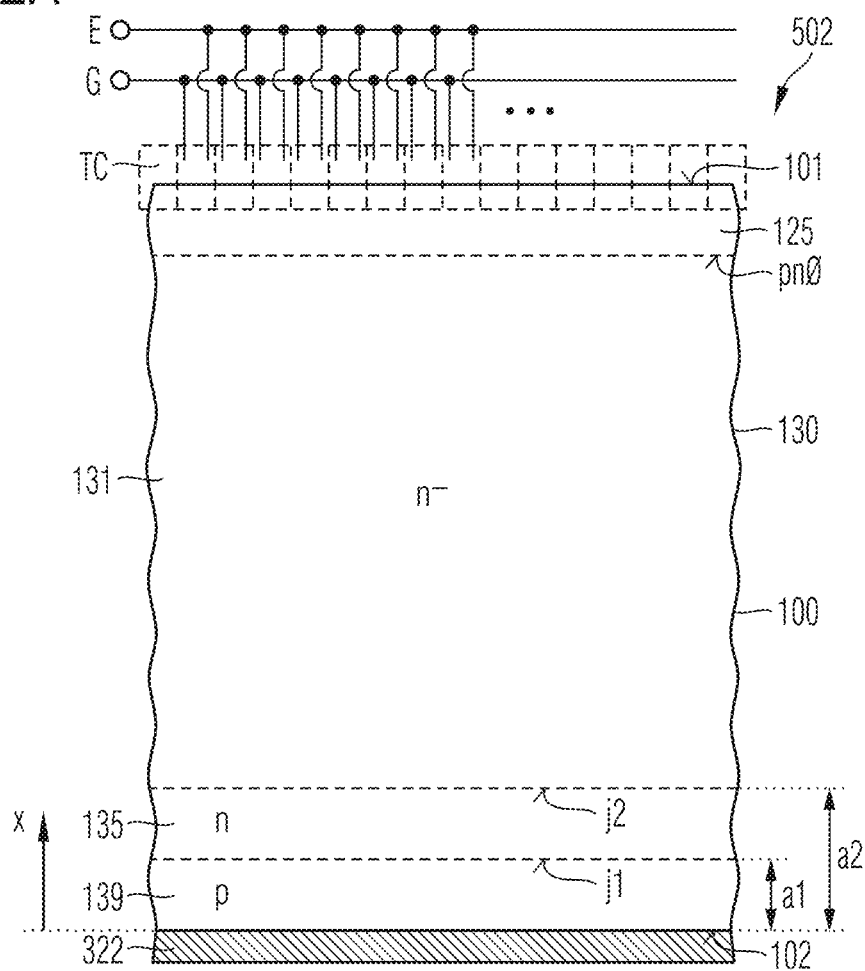
FIG. 12A is a schematic vertical cross-sectional view of a portion of an IGBT according to an embodiment concerning a collector layer with a box-shaped vertical dopant distribution.
Figure 12B:
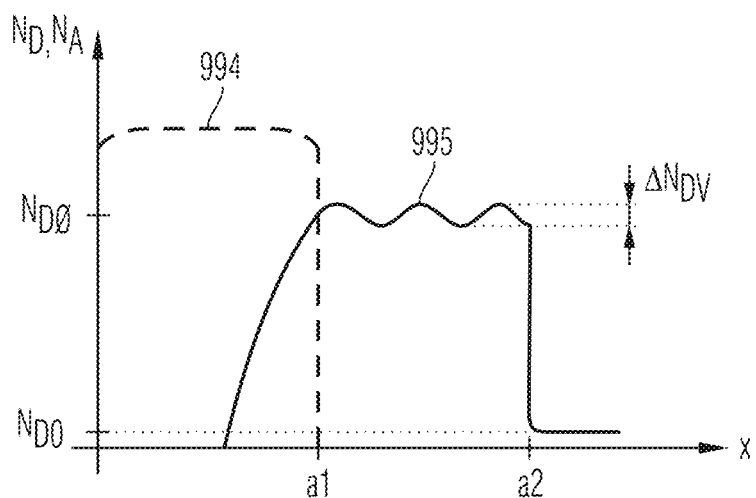
FIG. 12B is a schematic diagram illustrating vertical dopant distributions on a back of the IGBT of FIG. 12A.

FIGS. 12A and 12B apply equivalent considerations on an implanted field stop layer 135 of an IGBT 502.

Figure 13A:
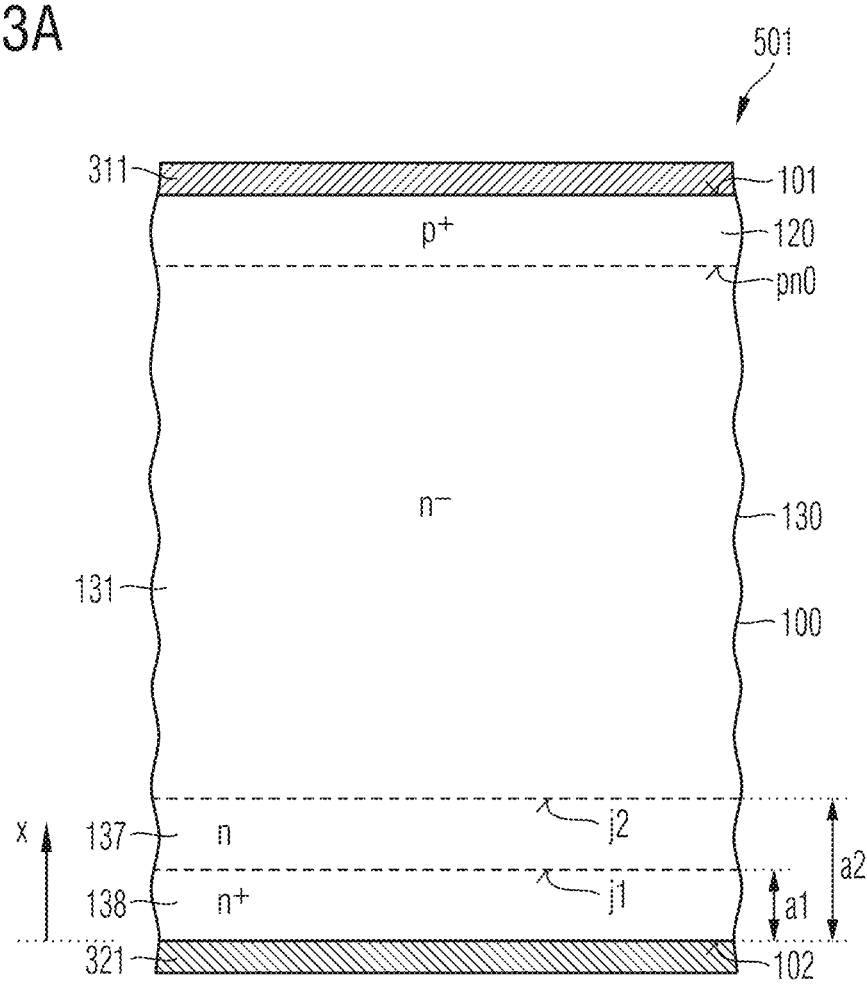
FIG. 13A is a schematic vertical cross-sectional view of a portion of a semiconductor diode according to an embodiment concerning a charge carrier compensation zone.

The semiconductor diode of FIG. 13A includes a charge carrier compensation zone 137 sandwiched between the drift zone 131 and the cathode structure 138 as a further example for a special shaping of doping gradients close to the second surface 102.

A dopant concentration in the charge carrier compensation zone 137 is higher than in a typical field stop layer. When, e.g., cosmic radiation triggers by impact ionization a local avalanche breakdown locally flooding the drift zone 131 with charge carriers and electrons move into direction of the cathode electrode 321, the ionized donor atoms in the charge carrier compensation zone compensate the electrons and attenuate a local electric field, such that no further charge carrier formation can be triggered at the back side. A minimum dopant concentration in the charge carrier compensation zone 137 is between 2E16 cm$^{-3}$ and 1E17 cm$^{-3}$ and a maximum dopant concentration in a range from 1E18 to 5E18 cm$^{-3}$.

Figure 13B:
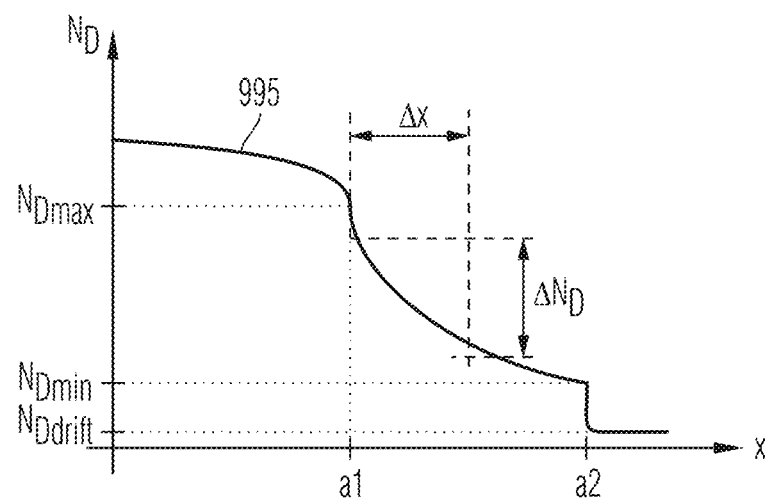
FIG. 13B is a schematic diagram illustrating vertical dopant distributions on a back of the semiconductor diode of FIG. 13A.

According to FIG. 13B a gradient $\Delta N_D/\Delta x$ of a vertical donor distribution 995 in direction of the second surface 102 is at most 2E21 cm$^{-4}$ within the charge carrier compensation zone 137. The charge carrier compensation zone 137 may be implemented in an IGBT, with a p-doped collector structure instead of the n-doped cathode structure 138.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor diode, comprising:
    a backside structure forming a pn junction with an anode region;
    a lightly doped drift zone in the backside structure;
    a heavily doped cathode structure directly adjoining a metal cathode electrode; and
    a field stop layer forming a first junction with the cathode structure and a second junction with the drift zone, wherein a second junction depth of the second junction with reference to an interface between the metal cathode electrode and the cathode structure is greater than 500 nm and at the second junction a dopant density changes by at least one order of magnitude for every 50 nm change along a depth direction.

2. The semiconductor diode of claim 1, wherein at the first junction a dopant density changes by at least two orders of magnitude for every 50 nm change along the depth direction.

3. The semiconductor diode of claim 1, further comprising:
    counter-doped regions forming third junctions with the field stop layer, wherein a third junction depth of the third junctions with reference to the metal cathode electrode is greater than 500 nm and at the third junctions a dopant density changes by at least one order of magnitude for every 10 nm change along the depth direction.

4. An insulated gate bipolar transistor comprising:
    a backside structure forming pn junctions with body regions of transistor cells formed at a front side;
    a lightly doped drift zone in the backside structure;
    a doped collector structure directly adjoining a metal collector electrode; and
    a field stop layer forming a first junction with the collector structure and a second junction with the drift zone, wherein a second junction depth of the second junction with reference to an interface between the metal collector electrode and the collector structure is greater than 500 nm and at the second junction a dopant density changes by at least one order of magnitude for every 50 nm change along a depth direction.

5. The insulated gate bipolar transistor of claim 4, wherein at the first junction a dopant density changes by at least two orders of magnitude for every 50 nm change along the depth direction.

6. The insulated gate bipolar transistor of claim 4, further comprising:
    counter-doped regions forming third junctions with the field stop layer, wherein a third junction depth of the third junctions with reference to the metal collector electrode is greater than 500 nm and at the third junctions a dopant density changes by at least two orders of magnitude for every 50 nm change along the depth direction.

7. A semiconductor diode comprising:
    a cathode electrode;
    a cathode disposed over the cathode electrode having a first doping type;
    a field stop layer disposed over the cathode having the first doping type;
    a drift zone disposed over the field stop layer having the first doping type;
    an anode disposed over the drift zone having a second doping type; and
    an anode electrode disposed over the anode,
    wherein the cathode comprises a first dopant concentration, the field stop layer comprises a second dopant concentration, and the drift zone comprises a third dopant concentration, wherein the first dopant concentration is greater than the second dopant concentration, wherein the second dopant concentration is greater than the third dopant concentration, and wherein a junction depth between the cathode and the field stop layer comprises a change of doping density of at least one order of magnitude per 50 nm of depth.

8. The semiconductor diode of claim 7, wherein the first dopant concentration comprises a box-shaped dopant concentration.

9. The semiconductor diode of claim 7, wherein the second dopant concentration comprises a box-shaped dopant concentration.

10. The semiconductor diode of claim 7, wherein a mean dopant concentration in the field stop layer is between 1E14 cm$^{-3}$ and 1E16 cm$^{-3}$, and wherein the dopant concentration is substantially uniform.

11. The semiconductor diode of claim 7, wherein a junction depth between the cathode and the field stop layer ranges from 20 nm to about 800 nm from a bottom surface of the cathode.

12. The semiconductor diode of claim 7, wherein a junction depth between the field stop layer and the drift zone comprises a change of doping density of at least one order of magnitude per 50 nm of depth.

13. The semiconductor diode of claim 7, wherein a junction depth between the field stop layer and the drift zone ranges from 100 nm to 3.0 µm from a bottom surface of the cathode.

14. The semiconductor diode of claim 7, wherein a junction depth between the field stop layer and the drift zone ranges from 500 nm to 1.5 µm from a bottom surface of the cathode.

15. The semiconductor diode of claim 7, wherein the second dopant concentration deviates from a mean second dopant concentration by a deviation of not more than 50%.

16. The semiconductor diode of claim 7, wherein the first dopant concentration comprises a Gaussian dopant concentration.

17. The semiconductor diode of claim 7, wherein the first dopant concentration comprises a plurality of Gaussian dopant concentrations.

18. The semiconductor diode of claim 7, wherein the second dopant concentration comprises a Gaussian dopant concentration.

19. The semiconductor diode of claim 7, wherein the second dopant concentration comprises a plurality of Gaussian dopant concentrations.

20. A semiconductor diode comprising:
    a cathode electrode;

a cathode disposed over the cathode electrode having a first doping type;
a field stop layer disposed over the cathode having the first doping type;
a drift zone disposed over the field stop layer having the first doping type;
an anode disposed over the drift zone having a second doping type; and
an anode electrode disposed over the anode,
wherein the cathode comprises a first dopant concentration, the field stop layer comprises a second dopant concentration, and the drift zone comprises a third dopant concentration, wherein the first dopant concentration is greater than the second dopant concentration, wherein the second dopant concentration is greater than the third dopant concentration, and wherein the second dopant concentration deviates from a mean second dopant concentration by a deviation of not more than 50%.

* * * * *